(12) United States Patent
Lazier

(10) Patent No.: US 9,838,042 B1
(45) Date of Patent: *Dec. 5, 2017

(54) DATA RETRIEVAL OPTIMIZATION FOR REDUNDANCY CODED DATA STORAGE SYSTEMS WITH STATIC REDUNDANCY RATIOS

(71) Applicant: Amazon Technologies, Inc., Seattle, WA (US)

(72) Inventor: Colin Laird Lazier, Seattle, WA (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 52 days.

This patent is subject to a terminal disclaimer.

(21) Appl. No.: 14/742,686

(22) Filed: Jun. 17, 2015

(51) Int. Cl.
| | | |
|---|---|---|
| *G11C 29/00* | (2006.01) | |
| *H03M 13/29* | (2006.01) | |
| *G06F 11/10* | (2006.01) | |
| *H03M 13/35* | (2006.01) | |
| *H04L 29/08* | (2006.01) | |

(52) U.S. Cl.
CPC ..... *H03M 13/2942* (2013.01); *G06F 11/1076* (2013.01); *H03M 13/35* (2013.01); *H04L 67/1097* (2013.01)

(58) Field of Classification Search
CPC ........... H03M 13/2942; H03M 13/373; H03M 13/1102; H03M 13/3761; H03M 13/1515; G06F 11/1076; G06F 17/30371; G06F 17/30997; G06F 17/30073; G06F 21/6218; G06F 21/6209; G06F 21/606; G06F 11/1008; G06F 1/266; G06F 1/3268; H04L 67/1097; H04L 63/08
See application file for complete search history.

(56) References Cited

U.S. PATENT DOCUMENTS

| | | | |
|---|---|---|---|
| 7,716,180 | B2 | 5/2010 | Vermeulen et al. |
| 8,806,296 | B1 | 8/2014 | Lazier |
| 8,850,288 | B1 | 9/2014 | Lazier et al. |
| 8,869,001 | B1 | 10/2014 | Lazier |
| 8,935,221 | B1 | 1/2015 | Lazier et al. |
| 8,959,067 | B1 | 2/2015 | Patiejunas et al. |
| 9,002,805 | B1 | 4/2015 | Barber et al. |
| 9,003,144 | B1 | 4/2015 | Hayes et al. |
| 9,021,297 | B1 | 4/2015 | Hayes et al. |

(Continued)

*Primary Examiner* — Guerrier Merant
(74) *Attorney, Agent, or Firm* — Davis Wright Tremaine LLP

(57) ABSTRACT

Techniques described and suggested herein include systems and methods for improving data performance characteristics for data archives stored on data storage systems using redundancy coding techniques, without necessitating expansion of the implementing data storage system. For example, redundancy coded shards, which may include identity shards that contain unencoded original data of archives, may be configured such that a variable number of the shards can be leveraged to meet performance requirements for retrieval requests associated with the archives stored and/or encoded therein. Multiple shards may be assigned to devices in an existing infrastructure to improve performance characteristics without changing redundancy code parameters. Implementing systems may monitor random access rates, capabilities, and burdens, so as to adaptively account for changes to some or all of the monitored parameters.

20 Claims, 20 Drawing Sheets

(56) References Cited

U.S. PATENT DOCUMENTS

| | | |
|---|---|---|
| 9,052,942 B1 | 6/2015 | Barber et al. |
| 9,092,441 B1 | 7/2015 | Patiejunas et al. |
| 9,110,797 B1 | 8/2015 | Lazier |
| 9,165,002 B1 | 10/2015 | Lazier |
| 9,213,485 B1 | 12/2015 | Hayes et al. |
| 9,213,709 B2 | 12/2015 | Patiejunas et al. |
| 9,223,789 B1 | 12/2015 | Seigle et al. |
| 9,225,675 B2 | 12/2015 | Patiejunas et al. |
| 9,250,811 B1 | 2/2016 | Patiejunas |
| 9,251,097 B1 | 2/2016 | Kumar et al. |
| 9,256,761 B1 | 2/2016 | Sahu et al. |
| 9,281,845 B1 | 3/2016 | Lazier |
| 9,354,683 B2 * | 5/2016 | Patiejunas ............... G06F 1/266 |
| 9,367,243 B1 | 6/2016 | Hayes et al. |
| 9,459,959 B1 | 10/2016 | Franklin et al. |
| 9,495,249 B1 | 11/2016 | Franklin et al. |
| 9,513,820 B1 | 12/2016 | Shalev |
| 9,563,681 B1 | 2/2017 | Patiejunas et al. |
| 2004/0128470 A1 | 7/2004 | Hetzler et al. |
| 2007/0156842 A1 | 7/2007 | Vermeulen et al. |
| 2009/0094250 A1 | 4/2009 | Dhuse et al. |
| 2011/0078277 A1 | 3/2011 | Baptist |
| 2011/0296195 A1 | 12/2011 | Nakagawa et al. |
| 2012/0011398 A1 | 1/2012 | Eckhardt et al. |
| 2012/0079189 A1 | 3/2012 | Colgrove et al. |
| 2012/0079190 A1 | 3/2012 | Colgrove et al. |
| 2013/0007511 A1 | 1/2013 | Gaertner et al. |
| 2014/0046906 A1 * | 2/2014 | Patiejunas ......... G06F 17/30371 707/661 |
| 2014/0046908 A1 | 2/2014 | Patiejunas et al. |
| 2014/0046909 A1 | 2/2014 | Patiejunas et al. |
| 2014/0047040 A1 | 2/2014 | Patiejunas et al. |
| 2014/0047261 A1 * | 2/2014 | Patiejunas ............... G06F 1/266 713/330 |
| 2014/0351632 A1 | 11/2014 | Grube et al. |
| 2014/0372383 A1 | 12/2014 | Sipek |
| 2015/0278324 A1 | 10/2015 | Wong et al. |
| 2015/0355974 A1 | 12/2015 | Hayes et al. |
| 2015/0356005 A1 * | 12/2015 | Hayes ................. G06F 12/0238 711/102 |
| 2016/0041868 A1 * | 2/2016 | Davis ................. G06F 11/1008 714/773 |
| 2016/0041878 A1 | 2/2016 | Davis et al. |
| 2016/0041887 A1 | 2/2016 | Davis et al. |
| 2016/0085797 A1 | 3/2016 | Patiejunas et al. |
| 2016/0179824 A1 | 6/2016 | Donlan et al. |
| 2017/0024281 A1 | 1/2017 | Franklin et al. |
| 2017/0060687 A1 | 3/2017 | Franklin et al. |

* cited by examiner

US 9,838,042 B1

DATA RETRIEVAL OPTIMIZATION FOR REDUNDANCY CODED DATA STORAGE SYSTEMS WITH STATIC REDUNDANCY RATIOS

CROSS REFERENCE TO RELATED APPLICATIONS

This application incorporates by reference for all purposes the full disclosure of co-pending U.S. patent application Ser. No. 14/742,684, filed concurrently herewith, entitled "RANDOM ACCESS OPTIMIZATION FOR REDUNDANCY CODED DATA STORAGE SYSTEMS," co-pending U.S. patent application Ser. No. 14/742,683, filed concurrently herewith, entitled "INTER-FACILITY NETWORK TRAFFIC OPTIMIZATION FOR REDUNDANCY CODED DATA STORAGE SYSTEMS," co-pending U.S. patent application Ser. No. 14/742,685, filed concurrently herewith, entitled "DEVICE TYPE DIFFERENTIATION FOR REDUNDANCY CODED DATA STORAGE SYSTEMS," co-pending U.S. patent application Ser. No. 14/742,688, filed concurrently herewith, entitled "THROUGHPUT OPTIMIZATION FOR REDUNDANCY CODED DATA STORAGE SYSTEMS," co-pending U.S. patent application Ser. No. 14/742,687, filed concurrently herewith, entitled "DEVICE TYPE DIFFERENTIATION FOR REDUNDANCY CODED DATA STORAGE SYSTEMS," and co-pending U.S. patent application Ser. No. 14/742,689, filed concurrently herewith, entitled "LOCALITY-SENSITIVE DATA RETRIEVAL FOR REDUNDANCY CODED DATA STORAGE SYSTEMS."

BACKGROUND

The use of network computing and storage has proliferated in recent years. The resources for network computing and storage are often provided by computing resource providers who leverage large-scale networks of computers, servers and storage drives to enable clients, including content providers, online merchants and the like, to host and execute a variety of applications and web services. Content providers and online merchants, who traditionally used on-site servers and storage equipment to host their websites and store and stream content to their customers, often forego on-site hosting and storage and turn to using the resources of the computing resource providers. The usage of network computing allows content providers and online merchants, among others, to efficiently and to adaptively satisfy their computing needs, whereby the computing and storage resources used by the content providers and online merchants are added or removed from a large pool provided by a computing resource provider as need and depending on their needs.

The proliferation of network computing and storage, as well as the attendant increase in the number of entities dependent on network computing and storage, has increased the importance of optimizing data performance and integrity on network computing and storage systems. Data archival systems and services, for example, may use various types of error correcting and error tolerance schemes, such as the implementation of redundancy coding and data sharding. Furthermore, capacity and cost of persisting increasing quantities of data may be mitigated by the use of data storage devices or media that is considerably faster at sequential storage than random access storage, relative to other data storage devices.

BRIEF DESCRIPTION OF THE DRAWINGS

Various embodiments in accordance with the present disclosure will be described with reference to the drawings, in which.

DETAILED DESCRIPTION

Figure 1:
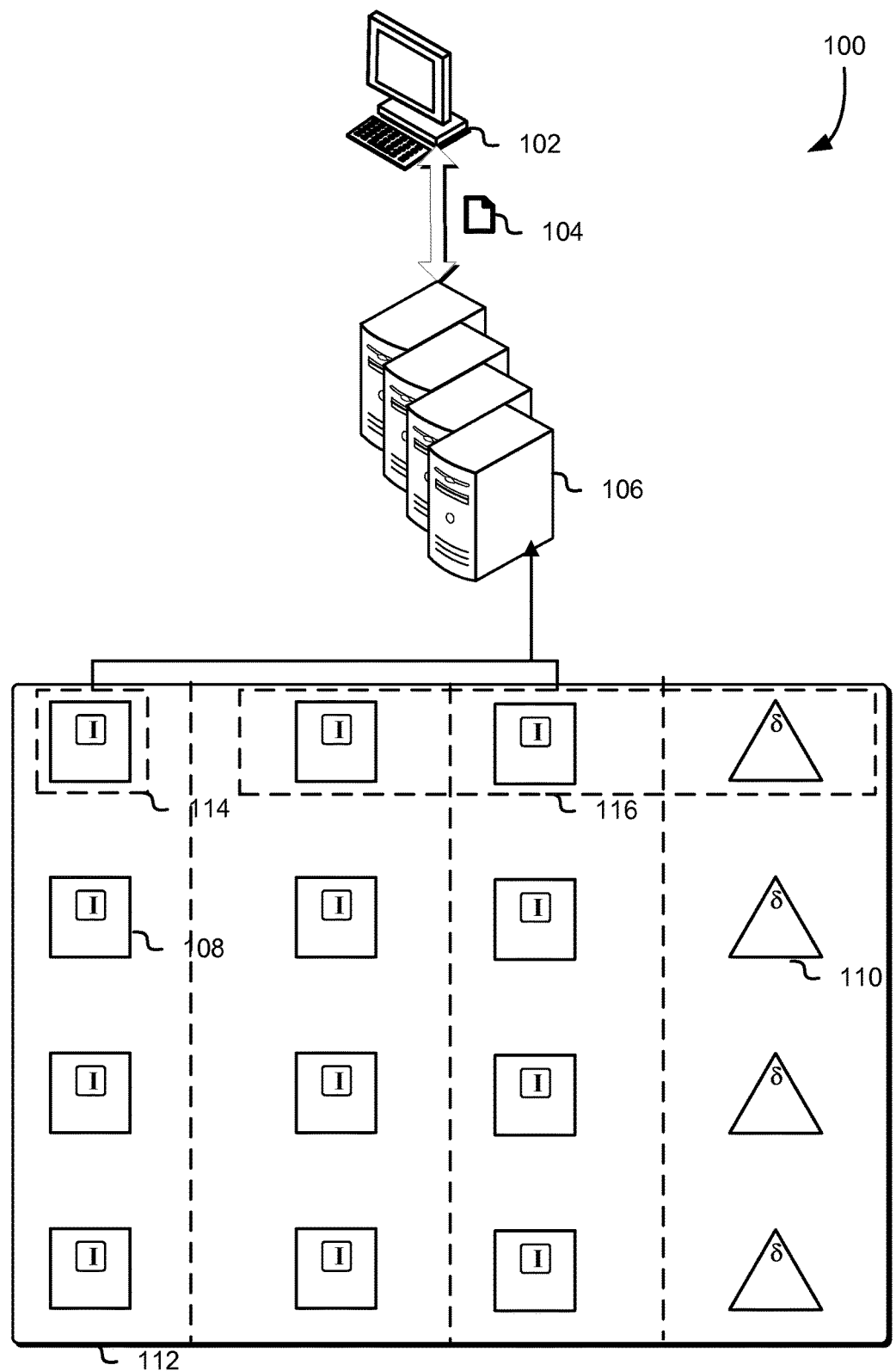
FIG. 1 schematically illustrates an environment for increasing performance characteristics associated with redundancy coded data stored on a data storage system, in accordance with some embodiments.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Techniques described and suggested herein include systems and methods for storing original data of data archives ("archives") on data storage systems using redundancy coding techniques. For example, redundancy codes, such as erasure codes, may be applied to incoming archives (such as those received from a customer of a computing resource service provider implementing the storage techniques described herein) so as allow the storage of original data of the individual archives available on a minimum of volumes, such as those of a data storage system, while retaining availability, durability, and other guarantees imparted by the application of the redundancy code.

In some embodiments, archives, such as customer archives containing any quantity and nature of data, are received from customers of a computing resource service provider through a service, such as an archival storage service, provided by one or more resources of the computing resource service provider. The archives may be sorted according to one or more common attributes, such as the identity of the customer, the time of upload and/or receipt by, e.g., the archival storage service. Such sorting may be performed so as to minimize the number of volumes on which any given archive is stored. In some embodiments, the original data of the archives is stored as a plurality of shards across a plurality of volumes, the quantity of which (either shards or volumes, which in some cases may have a one to one relationship) may be predetermined according to various factors, including the minimum number of total shards sufficient to reconstruct the original data using a redundancy code.

In some embodiments, the volumes may be grouped into volume sets, and in some of such embodiments, the volume sets may be apportioned into failure-decorrelated subsets of volumes (or "cohorts"). A given volume set may include, depending on the redundancy coding scheme used, volumes that store original data of incoming archives, as well as volumes that store derived data (e.g., with mathematical transformations applied according to the implementing redundancy coding scheme). The volume set may include more volumes than is necessitated by the implemented redundancy coding scheme. In such embodiments, a quantity of failure-decorrelated subsets of the volume set is determined such that the number of volumes in each failure-decorrelated subset corresponds to the number of volumes necessitated by the implemented redundancy coding scheme. In some embodiments, the failure-decorrelated subsets are implemented such that incoming archives to be stored in a given volume set are committed to different failure-decorrelated subsets, according to some apportionment scheme (e.g., based on an attribute of the incoming data itself, in a predetermined sequence, etc.)

In some embodiments, one or more indices may be generated in connection with, e.g., the order in which the archives are to be stored, as determined in connection with the sorting mentioned immediately above. An index may, in some embodiments, be generated for each volume of the plurality, and in such embodiments, may reflect the archives stored on the respective volume to which it applies. The indices may be of any appropriate type, and may include sparse indices. In embodiments where sparse indices are used, the index (e.g., for a given volume) may point to a subset of archives stored or to be stored on, e.g., that volume. The subset may be selected on any basis and for any appropriate interval. Examples may include the identification of the archives located at an interval of x blocks or bytes of the volume, or the identification of the archives at an interval of n archives, where x or n may be predetermined by, e.g., the archival storage service or an administrator thereof.

In some embodiments, the sparse indexes are used in connection with information relating to the sort order of the archives so as to locate archives without necessitating the use of dense indexes, e.g., those that account for every archive on a given volume. Such sort order-related information may reside on the volume(s) or, in some embodiments, on an entity separate from the volume(s). Similarly, the indexes may be stored on the same volume(s) to which they apply, or, in some embodiments, separately from such volume(s). In embodiments where the sort order-related information and/or the indexes are stored on the applicable volumes, they may be included with the original data of the archives and stored therewith as shards, as previously mentioned.

In some embodiments, the original data of the archives (and, in embodiments where the indices are stored on the volumes, the indices) is processed by an entity associated with, e.g., the archival storage service, using a redundancy code, such as an erasure code, so as to generate redundancy coded shards that may be used to regenerate the original data and, if applicable, the indices. In some embodiments, the redundancy code may utilize a matrix of mathematical functions (a "generator matrix"), a portion of which may include an identity matrix. In some of such embodiments, the redundancy coded shards may correspond, at least in part, to the portion of the generator matrix that is outside of the identity matrix. Redundancy coded shards so generated may be stored in further volumes. The total number of volumes may include the volumes bearing the original data (and indices) as well as the volumes containing the redundancy coded shards.

In some embodiments, the volumes bearing the original data may themselves be identity shards that are peers (i.e., are capable of fully participating in redundancy code-based regeneration) with the redundancy coded shards (encoded or derived shards). In such embodiments, bundles (groups) of shards of one or both types may be layered amongst one another, in some cases hierarchically. For example, rather than bearing only original data, one or more identity shards may be treated as a group of other shards, which may include additional identity shards, encoded shards, and/or some combination thereof. In some implementations, all shards, regardless of group/layer membership and/or hierarchy, may be peers and therefore freely interchangeable in terms of their ability to participate in reconstructing data represented across a system.

In some embodiments, redundancy coding schemes configured to store original data in at least some of the shards generated therefrom may impart an implementing system the ability to mitigate data loss even if a minimum quorum quantity of shards representing archive data is unavailable or corrupt. For example, if an implementing data storage system detects that a number of available shards approaches, equals, or drops below the minimum quorum quantity sufficient for reconstruction, the data storage system may prioritize the retrieval of the original data in, e.g., the identity shards and temporarily (or permanently) store them in a different data storage entity as part of the regeneration and/or recovery process. The original data thus stored may be made available to requesting customers, e.g., on demand, used to aid regeneration of the unavailable shards, or exist to provide additional durability guarantees, e.g., to customers of an implementing data storage system.

In some embodiments, retrieval of an archive stored in accordance with the techniques described herein may be requested by an entity, such as a client device under control of a customer of the computing resource service provider and/or the archival storage service provided therefrom, as described in further detail throughout this disclosure. In response to the request, the data storage system (e.g., the system including the aforementioned volumes, and providing the archival storage service) may locate, based on information regarding the sort order of the archives as stored on the volumes, the specific volume on which the archive is located. Thereafter, the index or indices may be used to locate the specific volume, whereupon it is read from the volume and provided to the requesting entity. In embodiments where sparse indexes are employed, the sort order information may be used to locate the nearest location (or archive) that is sequentially prior to the requested archive, whereupon the volume is sequentially read from that location or archive until the requested archive is found.

In some embodiments, retrieval of an archive stored in accordance with the techniques described herein may be carried out using a variable number of shards representing the archive so as to optimize various operational parameters related to the retrieval of the archive, the data storage devices, or other component or action. For example, a given archive may be retrieved directly from an identity shard containing original data associated with the requested archive. However, as operational parameters dictate, additional shards (e.g., including other shards which may in turn include both other identity shards as well as encoded shards) may be used to recreate the original data as well. Thus, the original data may be retrieved both directly and indirectly, and, based on the specific operational parameters and/or requirements, an implementing data storage system may select such direct retrieval, indirect retrieval, or a combination thereof, to achieve the desired result.

Some examples of such operational parameters that may influence an implementing system's decision as to whether to select either or both direct and indirect retrieval include seek capacity (e.g., associated with an identity shard hosting the original data, compared with that associated with regenerating such original data from other shards), throughput capacity, inter-facility data traffic minimization or optimization, online/offline status of the shards or entities associated with the shards, and the like. The decisions may be continuously adaptive (e.g., by the use of listeners and/or monitors), manually adjustable, or some combination thereof.

In some embodiments, additional shards may be allocated to various components, such as data storage facilities, of an implementing data storage system, so as to further increase the benefits of variable shard usage as described herein. In such embodiments, the additional shards may be allocated such that the total number of hosting components (e.g., data storage facilities), does not change. As a result, the encoding of archives into the shards (e.g., using a redundancy code) may not necessarily need to be modified to allocate the additional shards, thereby allowing for such improved efficiency without necessitating overhead associated with system-wide changes in implementation.

As may be contemplated, an additional benefit of storing data using the techniques described herein include the ability to store shards across non-homogenous components. In some embodiments, further optimization may be effected by differentiating the subsystems, data facility types, or data storage device types used to store groups of shards or individual shards, based on the nature of the data they contain. For example, identity shards may generally be stored in higher accessibility systems or devices, while encoded shards may be stored in higher durability systems or devices. Further improvements may be made by differentiating the storing systems or devices at a more granular level, such as by allocating identity shards containing more frequently accessed archives to higher performance systems or devices, and more stagnant archives to lower performance systems or devices.

In some embodiments, if one of the volumes or a shard stored thereon is detected as corrupt, missing, or otherwise unavailable, a new shard may be generated using the redundancy code applied to generate the shard(s) in the first instance. In some embodiments, the new shard may be a replication of the unavailable shard, such as may be the case if the shard includes original data of the archive(s). In some embodiments, the new shard may be selected from a set of potential shards as generated by, e.g., a generator matrix associated with the redundancy code, so as to differ in content from the unavailable shard (such as may be the case if the unavailable shard was a shard generated from the redundancy code, and therefore contains no original data of the archives). In such cases, in certain embodiments, an entirely new volume may be generated, rather than a shard.

FIG. 1 schematically illustrates an environment for increasing performance characteristics associated with redundancy coded data stored on a data storage system, in accordance with some embodiments. One or more client entities 102, such as those under control of a customer of a computing resource service provider, submit archive(s) 104 to a data storage system 106 for storage. As described in further detail herein, the client entities 102 may be any entity capable of transacting data with a data storage system, such as over a network (including the Internet). Also as described in further detail herein, the data storage system 106 may be any computing resource or collection of such resources capable of processing data for storage, and interfacing with one or more resources to cause the storage of the processed data. Also as described in further detail herein, the archives 104 may include any quantity of data in any format.

Using techniques described in further detail herein, the data storage system 106 or an entity associated with the data storage system 106 processes the archive 104 using a redundancy code, such as an erasure code, in such a way as to generate a plurality of shards 108, 110 that represent the archive 104 in a partially encoded form. For example, as illustrated, a set of shards (pictured as a horizontal row) may be generated to represent the archive, and the set may include identity shards 108 including the original data of the archive 104 and encoded shards 110 that include derivations of such data. As described in further detail herein, the identity shards 108, by virtue of containing the original data of the archive, may be read directly when retrieving the archives, while the remaining shards, which may include other identity shards (e.g., those containing original data of other archives) and one or more encoded shards 110, may collectively be read, and then processed using the redundancy code so as to recreate the original data of the archive 104.

As may be contemplated, a plurality of archives may be stored in any given identity shard, and multiple identity shards (as well as encoded shards) may be stored on the data storage system 106. The overall set of shards 112 stored on the data storage system may, according to techniques described in further detail herein, be used to optimize various aspects related to the retrieval of archives (e.g., upon request from the client entity 102). Such aspects may include operational parameters, such as performance requirements related to the request and/or various components of the data storage system requirements (e.g., of performance, security, durability, cost, etc.), customer-specified requirements (e.g., of performance, security, durability, cost, etc.), and the like. As may be contemplated, the operational parameters include a variety of axes, a plurality of which may be optimized for at any given time, such as seek rates and burdens, throughputs, timeframes for retrieval (e.g., retrieval times must not exceed a given length of time), locality (e.g., that of the requesting client, the data storage system, the shard(s) associated with the requested archive, or some combination thereof), inter-facility/inter-device data traffic, online/offline status of the constituent shards or associated data storage entities, and the like. Under certain circumstances, each shard of a set representing a given archive may be stored on a different device, device type, or even a different data storage system altogether, so as to more closely match the performance characteristics desired for each shard and/or shard type with that of the storing component and/or entity of the data storage system.

Durability may be measured in terms of annualized failure rate ("AFR"), daily failure rate ("DFR"), hourly failure rate ("HFR"), and the like. As used herein, the durability of a data object may be understood to be an estimate of the probability that the data object will not unintentionally become irretrievable (also referred to herein as "unavailable"). This durability is an estimated probability and is generally expressed as a percentage (e.g., 99.9999 percent). This durability is based on assumptions of probabilities of certain failures (e.g., the AFR of devices used to store the data) and may be based on an average failure rate, a maximum failure rate, a minimum failure rate, a mean failure rate, or some other such failure rate. The durability may be based on a statistical average of the failure over a collection of drives when there are many different drives and/or when there are many different types of drives. The durability may also be based on historical measurements of the failure of drives and/or statistical sampling of the historical measurements of the failure of drives. The durability may also be correlated with the probability that a data object will not unintentionally become unavailable such as, for example, basing the durability on the probability that a data object will unintentionally become unavailable. As may be contemplated, the methods of determining durability of data described herein are merely illustrative examples and other such methods of determining durability of data may be considered as within the scope of the present disclosure.

Durability may be calculated as a composite of failure rates associated with all layers, actions, and/or components of a given chain of entities associated with storing data for which durability is calculated. For example, a storage device may have a two percent (0.02) annual failure rate ("AFR"). Over the first hour that the data may be stored on that storage device there is, on average, a 0.00023 percent chance that the block storage device will fail (i.e., the block storage device may be 99.99977 percent reliable for the first hour). Similarly, the storage device may be 99.9945 percent reliable for the first day and 99.989 percent reliable through the second day. If it is desired that the data be 99.999 percent reliable (also referred to herein as having "five 9's" of durability), the data should be removed from the storage device with a two percent AFR before approximately four hours have passed (0.00023 percent chance of data loss per hour). If it is desired that the data be 99.99 percent reliable (also referred to herein as having "four 9's" of durability), the data should be removed from the storage device with a two percent AFR before two days have passed (0.0055 percent chance of data loss per day). As may be contemplated, the composite durability or AFR may be affected by the data storage device or other entity to which the data is being moved.

As such data generally may become less volatile over the first hour, or the first day, or the first two days, the data can then be moved to a more durable redundant storage system where the desired durability (e.g., four 9's, five 9's, or more) may be achieved by the durability of the data storage medium as well as by one or more redundancy encoding techniques such as those described herein.

Upon receiving a request to retrieve the archive 104 stored using the techniques described herein, under some circumstances, e.g., as dictated by the various considerations described above and throughout this disclosure, the implementing data storage system 106 may choose to read directly from the identity shard in which its original data is stored 114. In some embodiments, an implementing data storage system 106 may, by default, attempt to service requests for data from the identity shard(s) without accessing the other shard(s) unless otherwise required or determined. In some embodiments, the implementing data storage system 116 may read from the other shards 116, so as to regenerate the original data, e.g., by processing the data in the other shards 116 using the redundancy code. The implementing data storage system 106 may, under yet other circumstances, do both of the above, in some embodiments in parallel. In some embodiments, such decision making may be performed adaptively, e.g., monitoring and/or listening for events related to the various aspects used by the implementing system to determine whether to retrieve the requested archive from the identity shard 114, the other shards 116, or both.

Figure 2:
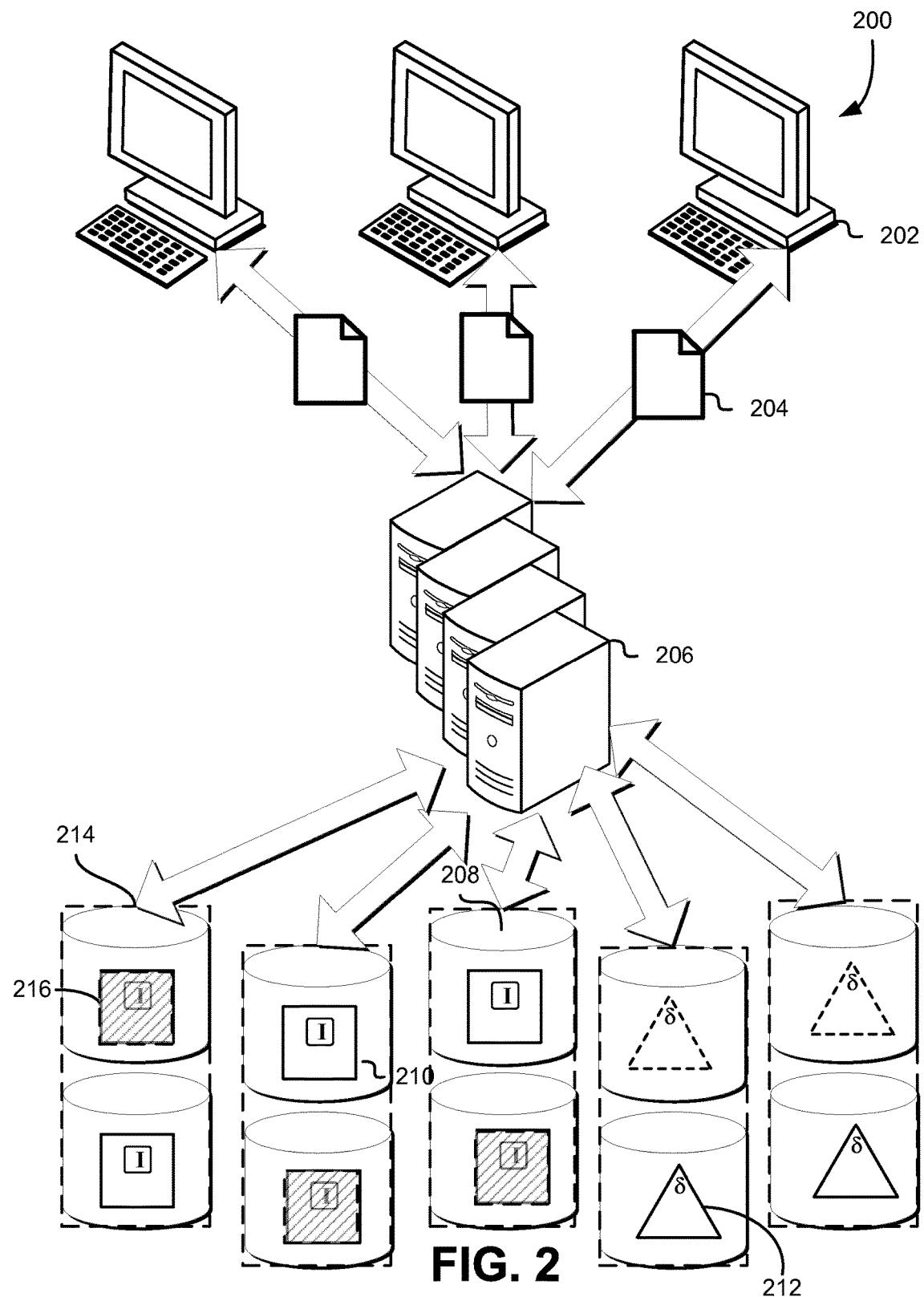
FIG. 2 schematically illustrates an environment in which original data of archives may be stored on a data storage system implementing a redundancy code, in accordance with some embodiments.

FIG. 2 schematically illustrates an environment in which original data of archives may be stored on a data storage system implementing a redundancy code, in accordance with some embodiments. One or more client entities 202, such as those under control of a customer of a computing resource service provider, submit archive(s) 204 to a data storage system 206 for storage. The client entities 202 may be any entity capable of transacting data with a data storage system, such as over a network (including the Internet). Examples include physical computing systems (e.g., servers, desktop computers, laptop computers, thin clients, and handheld devices such as smartphones and tablets), virtual computing systems (e.g., as may be provided by the computing resource service provider using one or more resources associated therewith), services (e.g., such as those connecting to the data storage system 206 via application programming interface calls, web service calls, or other programmatic methods), and the like.

The data storage system 206 may be any computing resource or collection of such resources capable of processing data for storage, and interfacing with one or more resources to cause the storage of the processed data. Examples include physical computing systems (e.g., servers, desktop computers, laptop computers, thin clients, and handheld devices such as smartphones and tablets), virtual computing systems (e.g., as may be provided by the computing resource service provider using one or more resources associated therewith), services (e.g., such as those connecting to the data storage system 206 via application programming interface calls, web service calls, or other programmatic methods), and the like. In some embodiments, the resources of the data storage system 206, as well as the data storage system 206 itself, may be one or more resources of a computing resource service provider, such as that described in further detail below. In some embodiments, the data storage system 206 and/or the computing resource service provider provides one or more archival storage services and/or data storage services, such as those described in further below, through which the client entities 202 may transact data such as the archives 204.

The archives 204 may include any quantity of data in any format. For example, the archives 204 may be single files, or, in some embodiments, may include several files. The archives 204 may be encrypted by, e.g., the client device(s) 202, or, in some embodiments, may be encrypted by a component of the data storage system 206 after receipt of the archives 204, such as on the request of a customer of the data storage system 206 and/or the computing resource service provider.

The data storage system 206 may sort the archives 204 according to one or more criteria (and in the case where a plurality of criteria is used for the sort, such criteria may be sorted against sequentially and in any order appropriate for the implementation). Such criteria may be attributes common to some or all of the archives, and may include the identity of the customer, the time of upload (e.g., by the client device 202) and/or receipt (by the data storage system 206), archive size, expected volume and/or shard boundaries relative to the boundaries of the archives (e.g., so as to minimize the number of archives breaking across shards and/or volumes), and the like. As mentioned, such sorting may be performed so as to minimize the number of volumes on which any given archive is stored. Such techniques may be used, e.g., to optimize storage in embodiments where the overhead of retrieving data from multiple volumes is greater than the benefit of parallelizing the retrieval from the multiple volumes. Information regarding the sort order may be persisted, e.g., by the data storage system 206, for use in techniques described in further detail herein.

As previously discussed, in some embodiments, one or more indices may be generated in connection with, e.g., the order in which the archives are to be stored, as determined in connection with the sorting mentioned immediately above. The index may be a single index or may be a multipart index, and may be of any appropriate architecture and may be generated according to any appropriate method. For example, the index may be a bitmap index, dense index, sparse index, or a reverse index. Embodiments where multiple indices are used may implement different types of indices according to the properties of, e.g., the archives 204 to be stored via the data storage system 206. For example, a data storage system 206 may generate a dense index for archives over a specified size (as the size of the index itself may be small relative to the number of archives stored on a given volume), and may also generate a sparse index for archives under that specified size (as the ratio of index size to archive size increases).

The data storage system 206 is connected to or includes one or more volumes 208 on which the archives 204, and in some embodiments, the generated indices, are stored. The volumes 208 may be any container, whether logical or physical, capable of storing or addressing data stored therein. In some embodiments, the volumes 208 may map on a one-to-one basis with the data storage devices on which they reside (and, in some embodiments, may actually be the data storage devices themselves). In some embodiments, the size and/or quantity of the volumes 208 may be independent of the capacity of the data storage devices on which they reside (e.g., a set of volumes may each be of a fixed size such that a second set of volumes may reside on the same data storage devices as the first set). The data storage devices may include any resource or collection of resources, such as those of a computing resource service provider, that are capable of storing data, and may be physical, virtual, or some combination of the two. For example, the data storage devices may be data storage facilities, such as those housing a plurality of physical storage servers and/or other such entities.

As previously described, one or more indices may, in some embodiments, be generated for each volume 208 of the plurality, and in such embodiments, may reflect the archives stored on the respective volume 208 to which it applies. In embodiments where sparse indices are used, a sparse index for a given volume may point to a subset of archives 204 stored or to be stored on that volume 208, such as those archives 204 which may be determined to be stored on the volume 208 based on the sort techniques mentioned previously. The subset of volumes to be indexed in the sparse index may be selected on any appropriate basis and for any appropriate interval. For example, the sparse index may identify the archives to be located at every x blocks or bytes of the volume (e.g., independently of the boundaries and/or quantity of the archives themselves). As another example, the sparse index may identify every nth archive to be stored on the volume 208. As may be contemplated, the indices (whether sparse or otherwise), may be determined prior to actually storing the archives on the respective volumes. In some embodiments, a space may be reserved on the volumes so as to generate and/or write the appropriate indices after the archives 204 have been written to the volumes 208.

In some embodiments, the sparse indexes are used in connection with information relating to the sort order of the archives so as to locate archives without necessitating the use of dense indexes, e.g., those that account for every archive 204 on a given volume 208. Such sort order-related information may reside on the volume(s) 208 or, in some embodiments, on an entity separate from the volume(s) 208, such as in a data store or other resource of a computing resource service provider. Similarly, the indexes may be stored on the same volume(s) 208 to which they apply, or, in some embodiments, separately from such volume(s) 208.

As mentioned, the archives 204 are stored, bit for bit (e.g., the "original data" of the archives), on a subset of the plurality of volumes 208. Also as mentioned, appropriate indices may also be stored on the applicable subset of the plurality of volumes 208. The original data of the archives is stored as a plurality of shards across a plurality of volumes, the quantity of which (either shards or volumes, which in some cases may have a one to one relationship) may be predetermined according to various factors, including the minimum number of total shards sufficient to reconstruct the original data using a redundancy code. In some embodiments, the number of volumes used to store the original data of the archives is the minimum quantity of shards sufficient to reconstruct the original data from a plurality of shards generated by a redundancy code from the original data. As an example, FIG. 2 illustrates five volumes, three of which contain original data 210 and two of which contain derived data 212, such as redundancy coded data. In the illustrated example, the redundancy code used may require any three shards to regenerate original data, and therefore, a quantity of three volumes may be used to write the original data (even prior to any application of the redundancy code).

The volumes 208 bearing the original data 210 may each contain or be considered as shards unto themselves. In embodiments where the sort order-related information and/or the indexes are stored on the applicable volumes 208, they may be included with the original data of the archives and stored therewith as shards, as previously mentioned. In the illustrated example, the original data 210 is stored as three shards (which may include the respective indices) on three associated volumes 208. In some embodiments, the original data 210 (and, in embodiments where the indices are stored on the volumes, the indices) is processed by an entity associated with, e.g., the archival storage service, using a redundancy code, such as an erasure code, so as to generate the remaining shards, which contain encoded information rather than the original data of the archives. The original data 210 may be processed using the redundancy code at any time after being sorted, such as prior to being stored on the volumes, contemporaneously with such storage, or after such storage.

Such encoded information may be any mathematically computed information derived from the original data, and depends on the specific redundancy code applied. As mentioned, the redundancy code may include erasure codes (such as online codes, Luby transform codes, raptor codes, parity codes, Reed-Solomon codes, Cauchy codes, Erasure Resilient Systematic Codes, regenerating codes, or maximum distance separable codes) or other forward error correction codes. In some embodiments, the redundancy code may implement a generator matrix that implements mathematical functions to generate multiple encoded objects correlated with the original data to which the redundancy code is applied. In some of such embodiments, an identity matrix is used, wherein no mathematical functions are applied and the original data (and, if applicable, the indexes) are allowed to pass straight through. In such embodiments, it may be therefore contemplated that the volumes bearing the original data (and the indexes) may correspond to objects encoded from that original data by the identity matrix rows of the generator matrix of the applied redundancy code, while volumes bearing derived data correspond to other rows of the generator matrix. In the example illustrated in FIG. 2, the five volumes 208 include three volumes that have shards (e.g., identity shards) corresponding to the original data of the archives 210, while two have encoded shards corresponding to the derived data 212. In this example, the applied redundancy code may result in the data being stored in a 3:5 scheme, wherein any three shards of the five stored shards are required to regenerate the original data, regardless of whether the selected three shards contain the original data or the derived data.

In some embodiments, if one of the volumes 208 or a shard stored thereon is detected as corrupt, missing, or otherwise unavailable, a new shard may be generated using the redundancy code applied to generate the shard(s) in the first instance. The new shard may be stored on the same volume or a different volume, depending, for example, on whether the shard is unavailable for a reason other than the failure of the volume. The new shard may be generated by, e.g., the data storage system 206, by using a quantity of the remaining shards sufficient to regenerate the original data (and the index, if applicable) stored across all volumes, regenerating that original data, and either replacing the portion of the original data corresponding to that which was unavailable (in the case that the unavailable shard contains original data), or reapplying the redundancy code so as to provide derived data for the new shard.

As previously discussed, in some embodiments, the new shard may be a replication of the unavailable shard, such as may be the case if the unavailable shard includes original data of the archive(s). In some embodiments, the new shard may be selected from a set of potential shards as generated by, e.g., a generator matrix associated with the redundancy code, so as to differ in content from the unavailable shard (such as may be the case if the unavailable shard was a shard generated from the redundancy code, and therefore contains no original data of the archives). As discussed throughout this disclosure, the shards and/or volumes may be grouped and/or layered.

In some embodiments, retrieval of an archive stored in accordance with the techniques described herein may be requested by an entity, such as a client entity 202 under control of a customer of the computing resource service provider and/or the archival storage service provided therefrom, as described in further detail throughout this disclosure. In response to the request, the data storage system 206 may locate, based on information regarding the sort order of the archives 204 as stored on the volumes 208, the specific volume 208 on which the archive 204 is located. Thereafter, the index or indices may be used to locate the specific archive, whereupon it is read from the volume and provided to the requesting client entity 202. In embodiments where sparse indexes are employed, the sort order information may be used to locate the nearest location (or archive) that is sequentially prior to the requested archive, whereupon the volume is sequentially read from that location or archive until the requested archive is found. In embodiments where multiple types of indices are employed, the data storage system 206 may initially determine which of the indices includes the most efficient location information for the request archive based on assessing the criteria used to deploy the multiple types of indices in the first instance. For example, if archives under a specific size are indexed in a sparse index and archives equal to or over that size are indexed in a parallel dense index, the data storage system 206 may first determine the size of the requested archive, and if the requested archive is larger than or equal to the aforementioned size boundary, the dense index may be used so as to more quickly obtain the precise location of the requested archive.

In some embodiments, the volumes 208 may be grouped such that each given volume 208 has one or more cohorts 214. In such embodiments, a volume set (e.g., all of the illustrated volumes 208) may be implemented that incoming archives to be stored on the volumes are apportioned to one or more failure-decorrelated subsets of the volume set. The failure-decorrelated subsets may be some combination of the volumes 208 of the volume subset, where the quantity of volumes correlates to a number of shards required for the implemented redundancy code. In the illustrated example, the overall volume set may comprise two failure-decorrelated subsets (volumes in a horizontal row) where a given constituent volume 208 is paired with a cohort (e.g., 214). In some embodiments, the incoming archives are apportioned to one or more of the cohorts in the failure-decorrelated subset according to, for example, a predetermined sequence, based on one or more attributes of the incoming archives, and the like.

The illustrated example shows, for clarity, a pair-wise cohort scheme, though other schemes are contemplated as within scope of this disclosure, some of which are outlined in greater detail herein. In the illustrated example, some of the volumes of the volume set store original data of incoming archives (e.g., 210, 216), while others store derived data (e.g., 212). The system (e.g., 206), may implement a number of failure-decorrelated subsets to which to store the incoming archives, and in the pair-wise scheme pictured, the volumes used for a given archive may differ based on some arbitrary or predetermined pattern. As illustrated, some archives may be apportioned to volumes of a given cohort that are assigned to one pattern, or failure-decorrelated subset (e.g., as shown by shaded archives and derived data 216), while others are apportioned to volumes in a different pattern (e.g., solid archives and derived data 210). The patterns, as mentioned, may be arbitrary, predefined, and/or in some cases, sensitive to attributes of the incoming data. In some embodiments, patterns may not be used at all, and the member volumes of a given failure-decorrelated subset may be selected randomly from a pool of volumes in the volume set.

Figure 3:
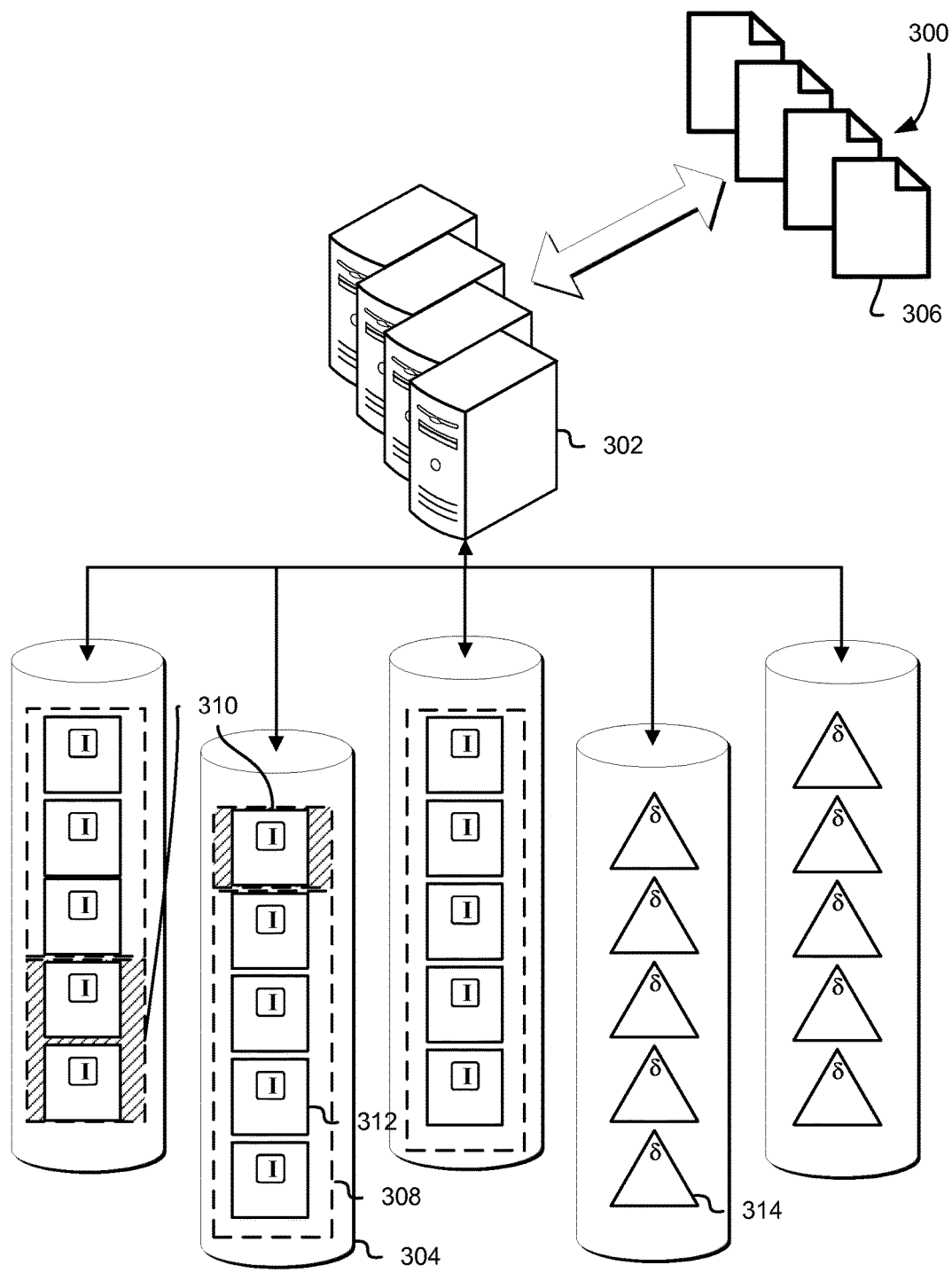
FIG. 3 schematically illustrates various workflows for storing original data of archives on a plurality of data stores of a data storage system, in accordance with some embodiments.

FIG. 3 schematically illustrates various workflows for storing original data of archives on a plurality of data stores of a data storage system, in accordance with some embodiments. A data storage system 302, which in some embodiments may be similar to the data storage system 306 described above in connection with FIG. 2, includes or is connected to a plurality of volumes 304, which may be similar to the volumes 308, also described above in connection with FIG. 2. Archives 306, such as those received from client entities 302 described in connection with FIG. 2, are processed by the data storage system 302 according to the techniques described in further detail herein.

As previously discussed, the data storage system 302 may sort the archives 306 according to one or more criteria (and in the case where a plurality of criteria is used for the sort, such criteria may be sorted against sequentially and in any order appropriate for the implementation). Such criteria may be attributes common to some or all of the archives, and may include the identity of the customer, abstractions defined by the customer (e.g., larger data objects associated with multiple archives of the same customer), the time of upload and/or receipt, archive size, expected volume and/or shard boundaries relative to the boundaries of the archives (e.g., so as to minimize the number of archives breaking across shards and/or volumes), unique identifiers of the archives themselves, and the like. As previously mentioned, such sorting may be performed so as to minimize the number of volumes on which any given archive is stored. For example, larger archives may be sorted based on expected volume size, such that larger archives are stored earlier in the volume and increasingly smaller archives are stored later in the volume. Such techniques may be used, e.g., to optimize storage in embodiments where the overhead of retrieving data from multiple volumes is greater than the benefit of parallelizing the retrieval from the multiple volumes. For example, devices using removable media may incur significant latency penalties when the media are physically changed, and the sort order may concatenate and apportion archives so as to minimize the number of removable media sufficient for the retrieval of the archives. As previously mentioned, information regarding the sort order may be persisted, e.g., by the data storage system 302, for use in techniques described in further detail herein.

In some embodiments, the data storage system 302 may sort the archives 306 two or more times, at least one of which may correspond to the various characteristics of the data storage system 302 and/or the volume 304 itself. For example, a first sort may include one or more of the criteria delineated above, and a second sort may, incident to actual storage of the archives 306 on one or more volumes 304, re-sort the sorted archives according to boundaries, storage space, and other volume characteristics, so as to optimize the storage of the archives 306.

As previously described (e.g., in connection with FIG. 2), one or more indices, of one or more types may, in some embodiments, be generated for each volume 304 of the plurality, and in such embodiments, may reflect the archives stored on the respective volume 304 to which it applies. In some embodiments, the indexes are used in connection with information relating to the sort order of the archives 306 so as to locate archives without necessitating the use of dense indexes, e.g., those that account for every archive 304 on a given volume 308. Such sort order-related information may reside on the volume(s) 304 or, in some embodiments, on an entity separate from the volume(s) 304, such as in a data store or other resource of a computing resource service provider. Similarly, the indexes may be stored on the same volume(s) 304 to which they apply, or, in some embodiments, separately from such volume(s) 304.

As mentioned, the original data 312 of archives 306 are stored on a subset of the plurality of volumes 304, and the quantity of the subset of volumes may be equal to the minimum number of shards required by the redundancy code to regenerate the original data. Also as mentioned, appropriate indices may also be stored on the applicable subset of the plurality of volumes 308, in connection with the original data 312 of the stored archives 308. The original data of the archives is stored as a plurality of shards across a plurality of volumes, the quantity of which (either shards or volumes, which in some cases may have a one to one relationship) may be predetermined according to various factors, including the minimum number of total shards sufficient to reconstruct the original data using a redundancy code.

As an example, FIG. 3 illustrates five volumes, three of which contain original data 312 of stored archives 308 (corresponding to the incoming archives 306), and two of which contain data 314 derived from mathematical functions of the applied redundancy code. In the illustrated example, the redundancy code used may require any three shards to regenerate original data, and therefore, a quantity of three volumes may be used to write the original data (prior to any application of the redundancy code). As discussed further herein, though a single set of five volumes 304 is illustrated, the volumes and/or shards may be grouped and/or layered in any configuration, including hierarchically.

Similarly to previously discussed, the volumes 304 storing the original data 312 of the stored archives 308 are processed, at a volume level, by an entity associated with, e.g., the archival storage service, using a redundancy code, such as an erasure code, so as to generate the remaining shards 314, which contain encoded information rather than the original data of the archives. As previously mentioned, the original data 312 may be processed using the redundancy code at any time after being sorted, such as prior to being stored on the volumes, contemporaneously with such storage, or after such storage. As illustrated by the shaded archive 310, a given archive may, in certain cases, break between two (or possibly more) volumes 304, due to size, placement, and the like. In embodiments where the redundancy code is applied at a volume level (e.g., the entirety of the contents of the volumes bearing the original data of the archives being considered as a single data object to be processed by the redundancy code), failure of one of the two volumes (or shards) on which the original data of the illustrated archive 310 resides may not necessitate rebuilding of both volumes, but only the volume that is unavailable.

The encoded information 314 may be any mathematically computed information derived from the original data 312, and depends on the specific redundancy code applied. In some embodiments, the redundancy code may implement a generator matrix that implements mathematical functions to generate multiple encoded objects correlated with the original data to which the redundancy code is applied. In some of such embodiments, an identity matrix is used, wherein no mathematical functions are applied and the original data (and, if applicable, the indexes) are allowed to pass straight through. It may be therefore contemplated that the volumes bearing the original data (and the indexes) 308 may correspond to objects encoded from that original data by the identity matrix rows of the generator matrix of the applied redundancy code, while volumes bearing derived data 314 correspond to other rows of the generator matrix.

Similarly to previously discussed, if one of the volumes 304 or a shard stored thereon is detected as corrupt, missing, or otherwise unavailable, a new shard may be generated using the redundancy code applied to generate the shard(s) in the first instance. The new shard may be stored on the same volume or a different volume, depending, for example, on whether the shard is unavailable for a reason other than the failure of the volume. The new shard may be generated by, e.g., the data storage system 302, by using a quantity of the remaining shards sufficient to regenerate the original data (and the index, if applicable) stored across all volumes, regenerating that original data, and either replacing the portion of the original data corresponding to that which was unavailable (in the case that the unavailable shard contains original data), or reapplying the redundancy code so as to provide derived data for the new shard. In embodiments where layered redundancy coding is used, in some of such embodiments, a subset (e.g., group) of the shards may be used to locally regenerate a given volume 304 and/or shard from shards within that particular subset, and if such local regeneration is not feasible, shards from outside a given subset may be used (e.g., those shards part of a higher hierarchical layer or other group).

As previously discussed, in some embodiments, the new shard may be a replication of the unavailable shard, such as may be the case if the unavailable shard includes original data of the archive(s). In some embodiments, the new shard may be selected from a set of potential shards as generated by, e.g., a generator matrix associated with the redundancy code, so as to differ in content from the unavailable shard (such as may be the case if the unavailable shard was a shard generated from the redundancy code, and therefore contains no original data of the archives).

Figure 4:
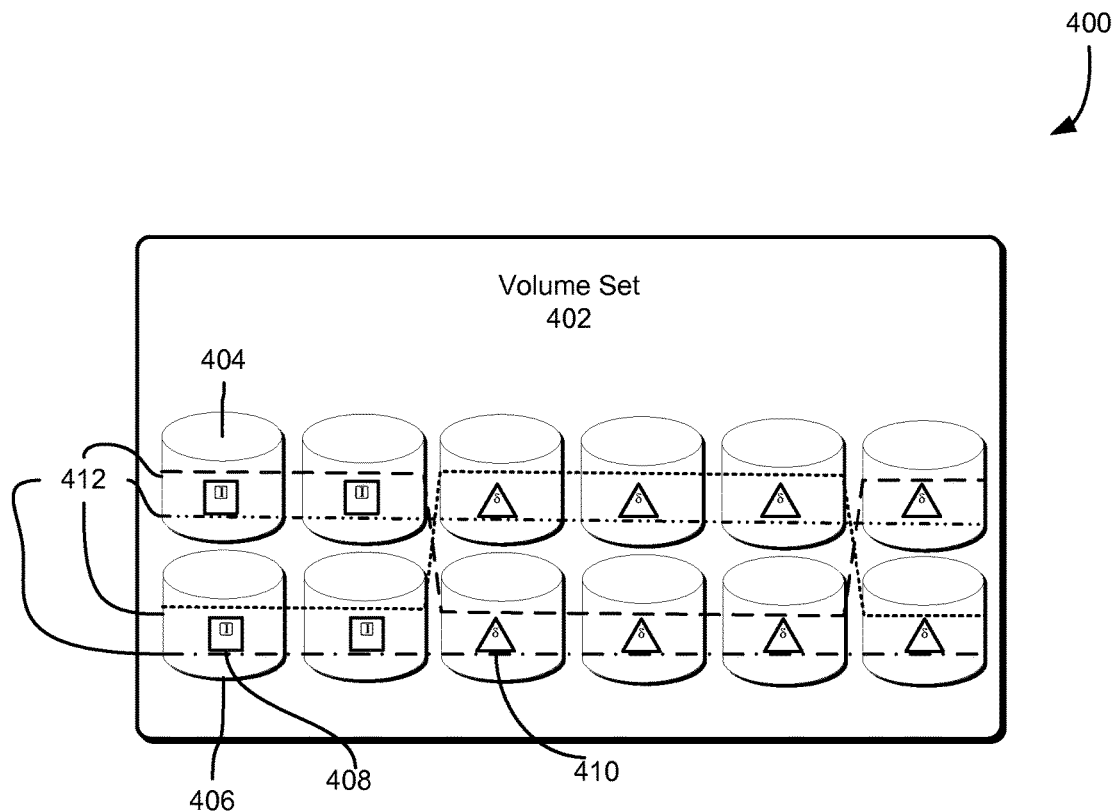
FIG. 4 schematically illustrates various workflows for storing data in failure-decorrelated subsets of a volume set, in accordance with some embodiments.

FIG. 4 schematically illustrates various workflows for storing data in failure-decorrelated subsets of a volume set, in accordance with some embodiments. A volume set 402 includes a plurality of volumes 404, which may in some instances be similar in implementation and characteristics to the volumes (e.g. 308) described in at least FIGS. 2 and 3 above. As pictured, the volumes 404 may be grouped such that each given volume 404 has one or more cohorts 406. In such embodiments, the volume set 402 may be implemented that incoming archives to be stored on the volumes are apportioned to one or more failure-decorrelated subsets 412 of the volume set (depicted illustratively by four generally horizontal traces). The failure-decorrelated subsets may be some combination of the volumes 404, 406 of the volume subset 402, where the quantity of volumes in each failure-decorrelated subset 412 correlates to a number of shards required for the implemented redundancy code.

As depicted, some of the volumes of the volume set 402 are designated as storing original data 408 of archives to be stored, and others are designated as storing derived data 410, such as may be the case when a redundancy code and volume-level encoding techniques such as described elsewhere herein are implemented. However, other storage mechanisms and schemes are contemplated hereby, including object-level encoding techniques. As previously mentioned, and in the illustrated example, the overall volume set 402 may comprise multiple failure-decorrelated subsets (volumes along one of the four horizontal traces depicted) where a given constituent volume 404 is paired with one or more cohort (e.g., 406). In some embodiments, the incoming archives are apportioned to one or more of the cohorts participating in one or more of the failure-decorrelated subsets 412 according to, for example, a predetermined sequence, based on one or more attributes of the incoming archives, and the like.

The illustrated example shows, for clarity, a pair-wise cohort scheme, though other schemes are contemplated as within scope of this disclosure, some of which are outlined in greater detail herein. As mentioned, in the illustrated example, some of the volumes 404, 406, 408 of the volume set 402 store original data of incoming archives (e.g., 406), while others store derived data (e.g., 410). The system may implement a number of failure-decorrelated subsets 412 to which to store the incoming archives, and in the pair-wise scheme pictured, the volumes used for a given archive may differ based on some arbitrary or predetermined pattern (such as those depicted by the horizontal traces 412). As illustrated, some archives may be apportioned to volumes of a given cohort that are assigned to one pattern or failure-decorrelated subset 412, while others are apportioned to volumes in a different pattern 412. The size of a given failure-decorrelated subset 412 may be adjusted, in some embodiments, to account for the characteristics of the expected incoming archives, the volumes themselves, or a combination. For example, the failure-decorrelated subsets 412 may be configured to have an arbitrary byte-size boundary (e.g., may contain X bytes), an object quantity boundary (e.g., may include X objects), or be a value derived from the quantity of failure-decorrelated subsets 412 desired.

The patterns, as mentioned, may be arbitrary, predefined, and/or in some cases, sensitive to attributes of the incoming data. For example, in the planar representation shown, the patterns 412 may be selected such that each of the volumes selected for the patterns are evenly allocated and/or accessed, with few or none of the members of each given cohort (e.g., vertical pair) over- or underrepresented in a given pattern. The patterns 412 may be predefined, e.g., independently of the attributes of the incoming data and selected to optimize some operational parameter, e.g., mean time between failure or annualized failure rate of each volume or device thereon, performance of each volume and/or device thereon, minimization of slack space, power-on time, and the like, and each pattern may be used and reused in some sequence and/or at some interval. For example, each N number of archives are stored to a given failure-decorrelated subset 412 before the following N archives are stored to the next failure-decorrelated subset in the sequence, and so on.

In other examples, attributes of the incoming archives may be used to apportion archives having those attributes to a given failure-decorrelated subset 412. For example, an identity value (or hash thereof), either unique to the incoming archive or a customer thereof, may be mapped such that a given range of values within the possible extent of values is mapped to a given sequence. In some embodiments, as a result, a customer may be able to have partial or full control over the specific failure-decorerlated subset to which their archives are stored.

In some embodiments, patterns may not be used at all, and the member volumes of a given failure-decorrelated subset may be selected randomly from a pool of volumes in the volume set. For example, the patterns 412 may be constructed out of random or pseudorandom combinations of eligible volumes (e.g., with the correct number of volumes capable of storing original data 404 and the correct number of volumes capable of storing derived data 410, according to the specific redundancy coding used.

Figure 5:
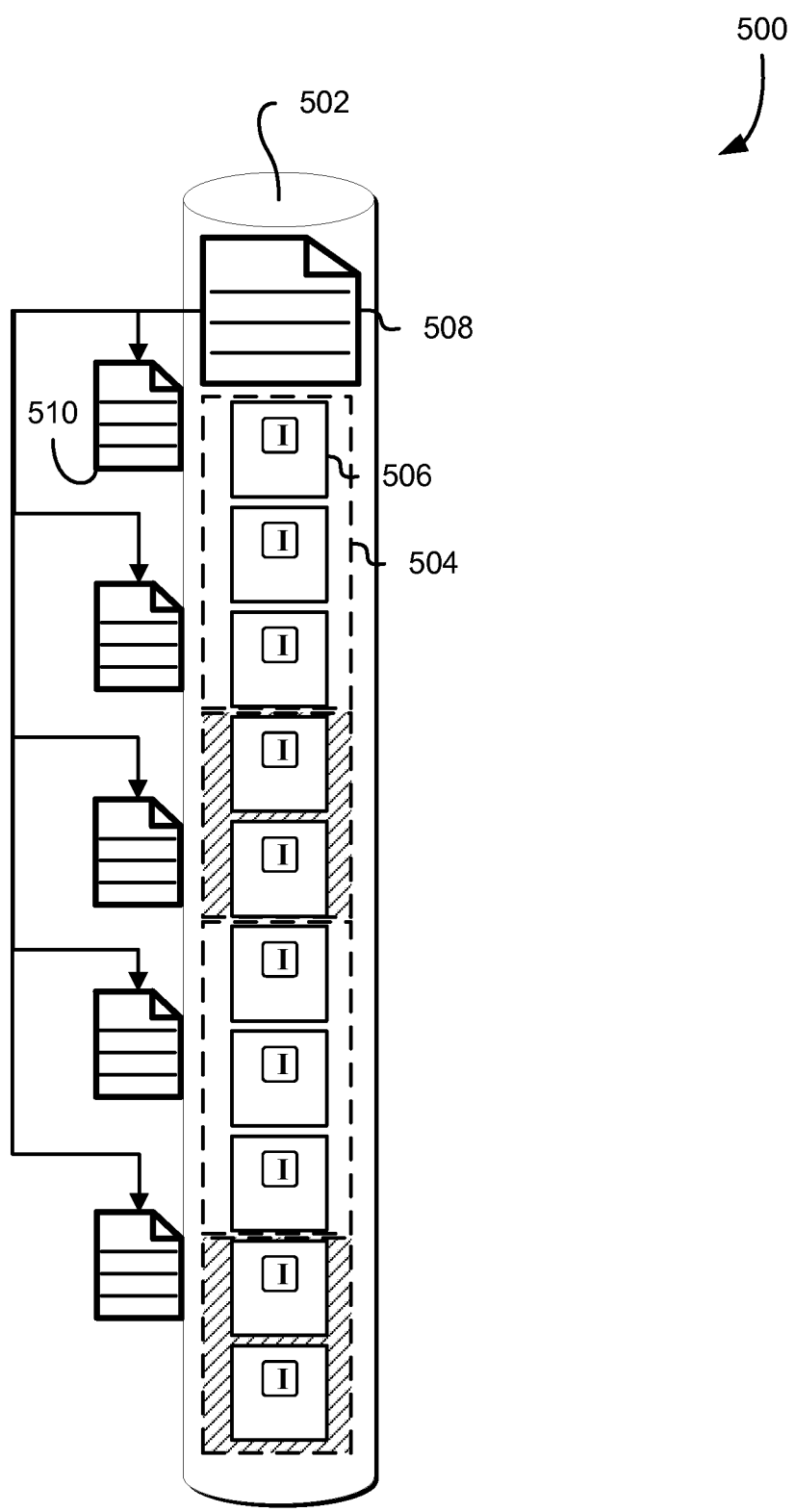
FIG. 5 schematically illustrates various workflows for indexing and locating data stored on a data storage system in accordance with some embodiments.

FIG. 5 schematically illustrates various workflows for indexing and locating data stored on a data storage system in accordance with some embodiments. A representative volume 502, which in some embodiments is similar to the volumes described above in connection with FIGS. 1 and 2, stores a plurality of archives 504, including the original data 506 as, e.g., received from a customer, such as that of a data storage system or other resource and/or service of a computing resource service provider to which the data storage system is attached. The archives 504 may have been sorted in connection with one of the techniques described above in connection with FIGS. 2 and 3, and information regarding the sort order may be persisted by, e.g., a resource directly or indirectly connected with the volume 502. The volume 502 may reside on (or consist of) one or more storage devices that are optimized for sequential data access, relative to random data access.

As previously discussed, in some embodiments, one or more indices 508 may be generated in connection with, e.g., the order in which the archives are to be stored, as determined in connection with the sorting mentioned previously. The index may be a single index or may be a multipart index, and may be of any appropriate architecture and may be generated according to any appropriate method. For example, the index may be a bitmap index, dense index, sparse index, or a reverse index. Embodiments where multiple indices are used may implement different types of indices according to the properties of, e.g., the archives 504 to be stored in the volume 502. For example, the volume 502 may utilize a dense index for archives over a specified size (as the size of the index itself may be small relative to the number of archives stored on a given volume), and may also generate a sparse index for archives under that specified size (as the ratio of index size to archive size increases).

In embodiments where sparse indices are used, a sparse index 508 for a given volume may point to subindexes 510, which in turn mark representative locations on the volume. The subindexes 510 may be an abstraction that points to data that resides at a predetermined interval. In some embodiments, the subindexes 510 may be additional data or metadata that is stored in connection with (or in some embodiments, directly upon) the volume, and at a predetermined interval. In such embodiments, it may be contemplated that the subindexes 510 may be stored as part of the shard on the volume, in a similar fashion as described in connection with FIGS. 1 and 2 above for the index and the original data of the archives.

In some embodiments, the predetermined interval may be in blocks, bytes, or other units of data. For example, the subindexes may identify the archives to be located at every x blocks or bytes of the volume (e.g., independently of the boundaries and/or quantity of the archives themselves). In some embodiments, the predetermined interval may be delinated by number of volumes. For example, the subindex may point to every nth archive to be stored on the volume 502. As may be contemplated, the sparse index 508 (and in some embodiments, the subindexes 510) may be generated and/or written at a time before the storage of the archives 504, contemporaneously with such storage, or after such storage. In some embodiments, the sparse index 508 and the subindexes 510 may be stored in a reserved space on the volume, e.g., after the archives 504 have been stored.

In some embodiments, the sparse index 508 is used in connection with information relating to the predetermined sort order of the archives 504 so as to locate specific archives. As previously mentioned, such sort order-related information may reside on the volume(s) 502 or, in some embodiments, on an entity separate from the volume(s) 502, such as in a data store or other resource of a computing resource service provider. An entity requesting a given archive stored on the volume 502 may determine, based on the sort order-related information and by reading the index 508, the nearest subindex that is sequentially prior to the requested archive on the volume 502. The requesting entity may then cause the volume 502 to be sequentially read from the location of that subindex 510 until the requested archive is located and fully read.

In embodiments where multiple types of indices are employed, the requesting entity may initially determine which of the indices includes the most efficient location information for the requested archive based on assessing the criteria used to deploy the multiple types of indices in the first instance. For example, if archives under a specific size are indexed in a sparse index and archives equal to or over that size are indexed in a parallel dense index, the requesting entity may first determine the size of the requested archive, and if the requested archive is larger than or equal to the aforementioned size boundary, may use the dense index in favor of the sparse index as to more quickly obtain the precise location of the requested archive.

Figure 6:
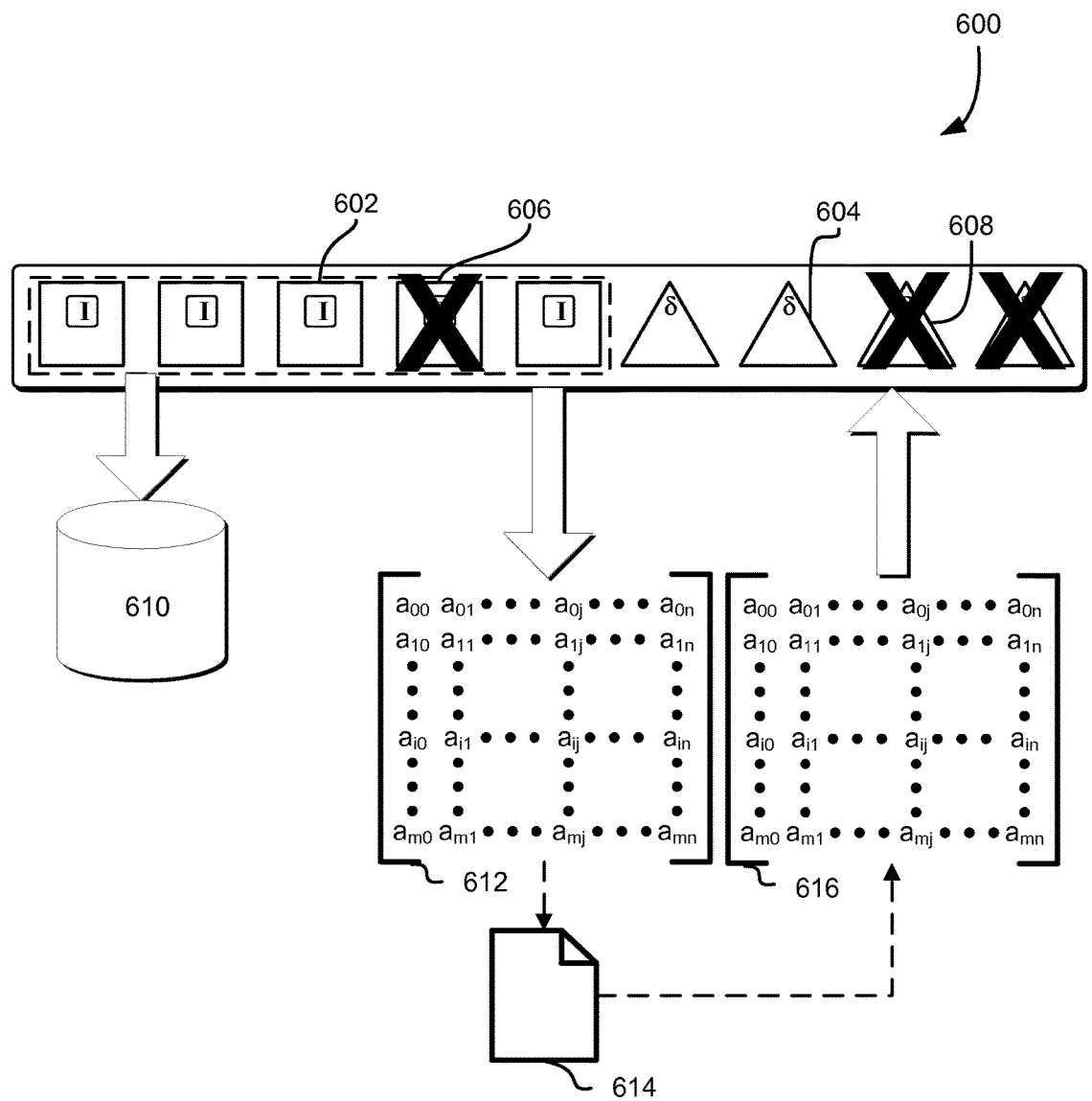
FIG. 6 schematically illustrates various workflows for mitigating data loss in systems using volume-level redundancy coding techniques, in accordance with some embodiments.

FIG. 6 schematically illustrates various workflows for mitigating data loss in systems using volume-level redundancy coding techniques, in accordance with some embodiments. In some embodiments, a group, layer, or set of redundancy coded shards representing one or more archives may be encoded such that the set includes identity shards 602 having some or all of the original data of the archives and encoded shards 604 including information derived from the original data, e.g., through one or more redundancy codes. In the case that some of the shards become unavailable 606, 608, various regeneration techniques, such as those described herein, may be initiated so as to attempt to bring those unavailable shards online. In some embodiments, if the total number of available shards drops to or below a predetermined level, such as one determined in connection with the minimum quorum quantity for the group of shards, the regeneration process may be initiated by first copying (or copying in parallel with other portions of the regeneration process) some or all of the available identity shards 602 to a data store 610, such as a cache, a data storage device, or other data storage entity to which the implementing data storage system has access. The data store 610 may be a part of the implementing data storage system, or, in some embodiments, may be separate from it.

As may be contemplated, in some cases, at the time at which the copying process is initiated, the actual number of available shards may be less than the minimum quorum quantity, or, in some cases, may drop below that minimum quorum quantity during part of the copying or the regeneration process. Under such circumstances, the shard set cannot be fully rebuilt, but by virtue of copying some or all of the identity shards to temporary storage, some of the represented data may be recovered.

The identity shards 602 copied to the data store 610 may be used for a variety of purposes while resident therein. For example, customer request for data represented by an otherwise unviable shard set may be serviced using original data stored in the data store 610. Additionally, the identity shards 602 may be used to aid the regeneration process. For example, if the number of available shards in the set drops below the minimum quorum quantity, e.g., during the regeneration process, if one or more of the identity shards was copied to the data store 610 prior to becoming unavailable, it may, in some cases, allow regeneration to continue. As another example, the original data contained in the identity shards 610 stored in the data store may be used to create a new shard set, even if the data represented is incomplete, so as to preserve redundancy for what original data remains.

The regeneration process (e.g., by decoding the available shards into the original data 614 using a decode matrix 612, then re-encoding the original data 614 using a generator matrix 616 so as to generate new shards to stand in for those that are unavailable) may be similar to analogous process described elsewhere herein. As previously mentioned, the copying process to the data store 610 may be performed at the outset of the regeneration process, prior to the regeneration process, or in parallel with the regeneration process. After the regeneration process is complete, the data stored in the data store 610 may be flushed, in some cases after a delay (e.g., so as to ascertain that the shard set will remain stably available after regeneration.

Figure 7:
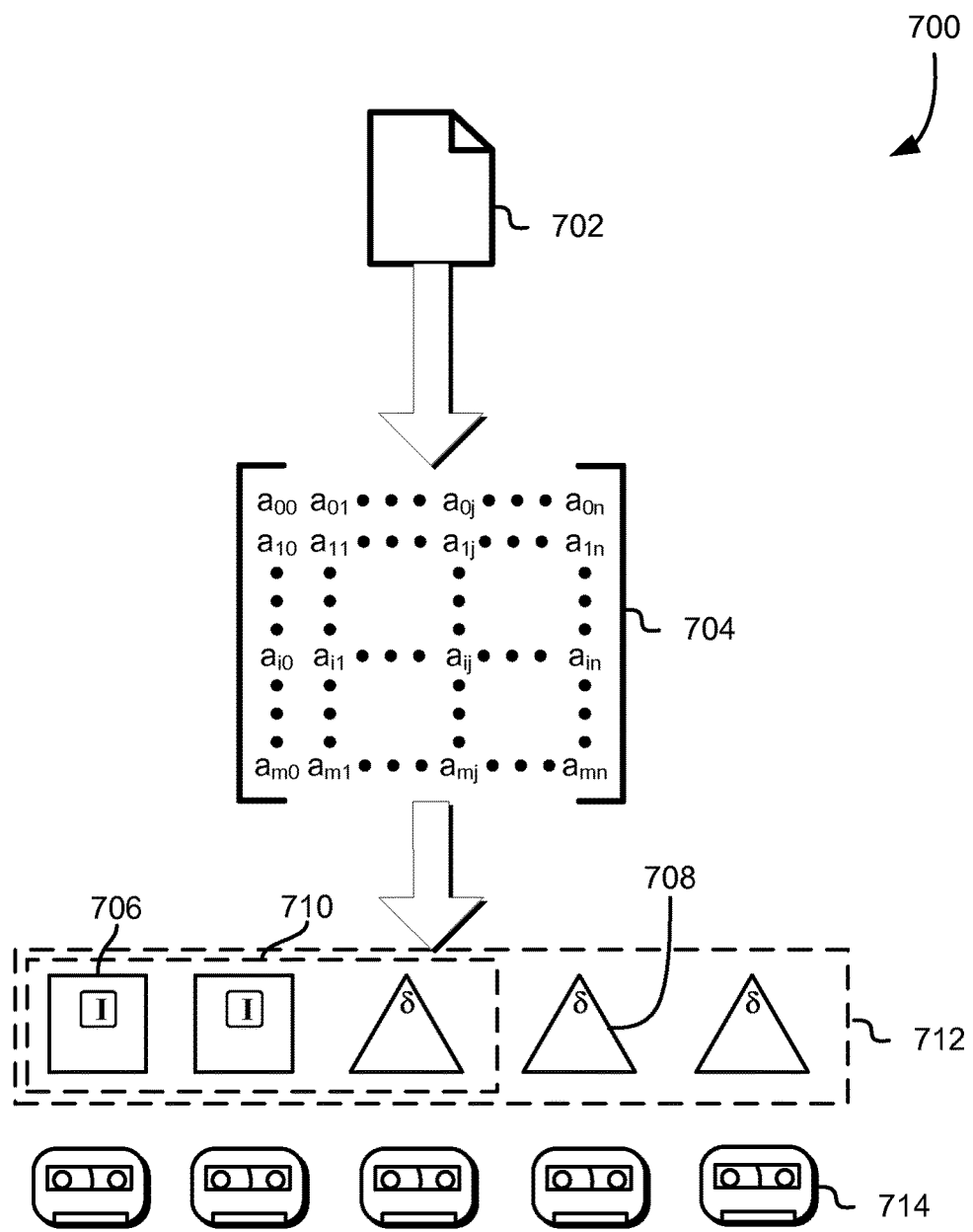
FIG. 7 schematically illustrates example workflows for layering redundancy coded data in groups, in accordance with some embodiments.

FIG. 7 schematically illustrates example workflows for layering redundancy coded data in groups, in accordance with some embodiments. One or more archives 702, which may include any quantity of data in any format as previously discussed, are processed using one or more redundancy codes 704 to generate shards 706, 708. The shards 706, 708, as described previously, represent portions of the data of the archives 702, and are usable, e.g., by reprocessing through one or more aspects of the redundancy code(s) 704 to regenerate the original data of the archives 702 and/or some or all of the shards 706, 708 that require replacement due to, e.g., failure, unavailability, corruption, and the like. Parameters of the redundancy code(s) 704 may be set so as to manipulate the minimum quantity (quorum quantity, described in more detail below) of the shards 706, 708 relative to the total number of shards 706, 708 used to represent the archive(s) 702.

As illustrated, the shards 706, 708 may include identity shards 706 and encoded (derived) shards 708, in accordance with one or more techniques (e.g., volume-level encoding techniques) described in further detail herein. Also as described in further detail herein, identity shards 706 may include data that is unchanged relative to the corresponding input data, e.g., of archive(s) 702 through redundancy code(s) 704. As may be contemplated, identity shards 706 may also represent data other than original data of the archives 702. For example, the identity shards 706 may include a group, or bundle, of other shards, other identity shards 706, other encoded shards 708, and the like. The encoded shards 108 include data that is transformed, e.g., by the redundancy code(s) 704, relative to the input. Examples, more of which are provided throughout this disclosure, include parity data associated with the input, XOR transformation output, erasure code outputs, and the like.

Also as illustrated, the shards may be grouped 710, 712, e.g., in a hierarchical manner. The shards may be grouped such that each individual group may itself be redundant in some manner, e.g., where the minimum quorum quantity for a given group is less than the total number of shards in that group. In the illustrated example, the group 710 of shards may be encoded such that the original data, or any of the shard in the group 710, may be regenerated using two of the three shards in the group 710. The illustrated group 710 is part of the group 712, which includes two additional encoded shards 708 and, for example, may be configured such that the minimum quorum quantity of the group 712 is three shards of the five total shards, including any of the three in the group 710. It is contemplated that, in some embodiments, shards in a given group may be configured such that may be usable to participate in regeneration of a subgroup, but not necessarily others in that group. For example, in the illustrated group 712, the two shards outside of group 710 may in some cases only be usable to rebuild the shards inside the group 710, as may be the case if the two shards outside of the group 710 are parity shards (e.g., exclusive or (XOR) transformations of the original data) derived from the shards of group 710.

As with other examples given herein, the immediately preceding example is not limiting. Any number or configuration of groups, as well as any configuration of shards (e.g., minimum quorum quantities, mixtures and/or configurations of identity shards and/or encoded shards), may be implemented as appropriate for a given system. In some embodiments, various configurations and/or parameters of the groups 710, 712 and/or the shards 706, 708 may be adjusted and/or adapted, either statically or dynamically, to alter the performance, efficiency, and/or redundancy characteristics of each group. Such adjustment and/or adaptation may be in response to various parameters and/or characteristics of the data storage system (or layers and/or entities thereof), the archives and/or associated data, customer requests, and the like.

As discussed further herein, each of the shards of the group may be stored on a volume 714, in some cases on a one-to-one basis. The volumes 714 may include physical data storage entities, such as data storage devices (e.g., tapes, optical devices, hard disk drives, solid state disk devices, and the like), and may be heterogeneous or homogenous relative to one another. For example, different groups may be assigned to different types of data storage entities, and the groups may be configured so as to be sensitive to the particular characteristics (e.g., failure characteristics) of the specific data storage entities chosen.

Figure 8:
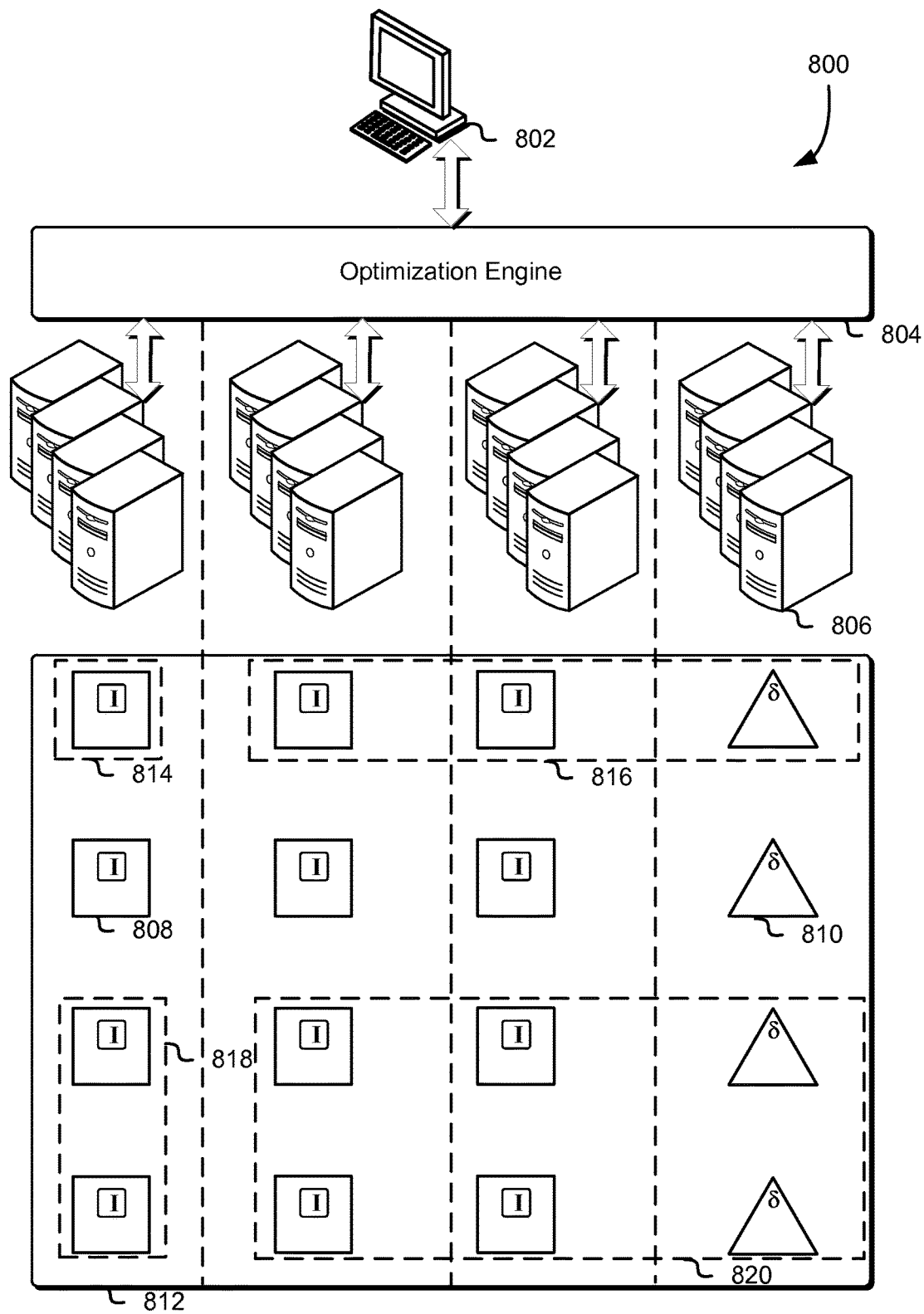
FIG. 8 schematically illustrates various workflows for increasing performance characteristics associated with redundancy coded data stored on a data storage system, using an optimization engine, in accordance with some embodiments.

FIG. 8 schematically illustrates various workflows for increasing performance characteristics associated with redundancy coded data stored on a data storage system, using an optimization engine, in accordance with some embodiments. One or more client entities 802, such as those under control of a customer of a computing resource service provider, submit archive(s) to a data storage system for storage. As previously discussed, the data storage system may be any computing resource or collection of such resources capable of processing data for storage, and interfacing with one or more resources to cause the storage of the processed data. In the illustrated example, the data storage system includes an optimization engine 804 and a plurality of data storage entities 806.

The optimization engine 804 may be any entity of the data storage system capable of assessing performance requirements of retrieval actions and requests and performance characteristics of the data storage devices. The optimization engine 804 may further assess, based on the aforementioned performance requirements and performance characteristics, a retrieval mode for requested archives that is tailored to such requirements and characteristics, as discussed in further detail herein. The optimization engine 804 may include listener entities, monitoring entities, and the like, so as to detect and/or be notified (e.g., by some other entity) of the aforementioned performance requirements and/or performance characteristics. In some embodiments, the use of listeners and/or monitoring entities enable adaptive selection, e.g, by the optimization engine 804, of the appropriate retrieval mode. In some embodiments, the optimization engine 804 may decide which retrieval mode to use based at least in part on whether the incoming request(s) are capable of being serviced by the data storage system, or components thereof, within a specified or determined (e.g., predetermined) timeframe (such as may be defined in a service-level agreement (SLA)).

Performance requirements, as mentioned, may either be inherent to the request itself (e.g., as a result of the nature of the request, or that of the data/archives requested), or may be separately defined by, e.g., the requesting customer, an administrator of the data storage system, or the like. Such performance requirements may include requirements related to random access burden incurred by or associated with a request, throughput (e.g., sequential) incurred by or associated with the request, geographic locality (e.g., relative geographic locations of the requestor and the shard(s) hosting the requested data), and the like. Similarly, the performance characteristics of the data storage devices may include random access capacity, random access rate (e.g., a current random access rate for a period of time relative to the point of request), throughput capacity, throughput rate, inter-device data transfer/traffic (e.g., inter-facility data/network transfer/traffic, in the case that the data storage devices are data storage facilities), and the like.

As previously discussed, the data storage devices 806 may include any entities capable of storing data, such as data storage servers, hard drives, tape drives, data storage facilities including multiple storage devices, and the like. Using techniques described in further detail herein, the data storage system or an entity associated with the data storage system processes the archive using a redundancy code, such as an erasure code, in such a way as to generate a plurality of shards 812 that represent the archives in a partially encoded form. For example, as illustrated, a set of shards (pictured as a horizontal row) may be generated to represent the archive, and the set may include identity shards 808 including the original data of the archive and encoded shards 810 that include derivations of such data. As described in further detail herein, the identity shards 808, by virtue of containing the original data of the archive, may be read directly when retrieving the archives, while the remaining shards, which may include other identity shards (e.g., those containing original data of other archives) and one or more encoded shards 810, may collectively be read, and then processed using the redundancy code so as to recreate the original data of the archive.

As discussed herein, a plurality of archives may be stored in any given identity shard, and multiple identity shards (as well as encoded shards) may be stored on the data storage system. The overall plurality of shards 812 stored on the data storage system may, according to techniques described in further detail herein, be used to optimize various aspects related to the retrieval of archives, as previously mentioned. Such aspects may include operational parameters, such as performance requirements related to the request and/or various components of the data storage system, customer-specified requirements (e.g., of performance), and the like. As may be contemplated, the operational parameters include a variety of axes, a plurality of which may be optimized for at any given time, such as seek rates and burdens, throughputs, timeframes for retrieval (e.g., retrieval times must not exceed a given length of time), locality (e.g., that of the requesting client, the data storage system, the shard(s) associated with the requested archive, or some combination thereof), inter-facility/inter-device data traffic, and the like. Under certain circumstances, each shard of a set representing a given archive may be stored on a different device, device type, or even a different data storage system altogether, so as to more closely match the performance characteristics desired for each shard and/or shard type with that of the storing component and/or entity of the data storage system.

Upon receiving a request to retrieve the archive stored using the techniques described herein, under some circumstances (e.g., as determined by the optimization engine 804), the implementing data storage system may read directly from the identity shard (e.g., 814) in which its original data of the requested archive is stored. In some embodiments, the data storage system may, by default, attempt to service retrievals directly out of the identity shard(s) without accessing the other (e.g., encoded, or other identity) shards. In circumstances where other shards are necessary to optimally retrieve the requested data, the optimization engine 804 may cause the data storage system to read from the other shards 816, so as to regenerate the original data, e.g., by processing the data in the other shards 816 using the redundancy code. The optimization engine may, under some circumstances, cause the data storage system to do both of the above at least partly in parallel. In cases where both the direct retrieval and the additional retrieval are executed in parallel, an intermediary data store may be used to combine (e.g., interleave, and/or buffer) the respective retrievals such that the requesting customer need only manage or receive the archive from a single source. Such an intermediary data store may be any data store capable of retaining data, either in hardware, software, or some combination thereof.

In some embodiments, the optimization engine 804 may optimize for random access characteristics and requirements. For example, a given shard (or device associated with the shard) may have a maximum random access capability, such as may be defined in input/output operations per second (IOPS). Under operation, in a multitenant system, some amount of the shard's maximum random access capability will be in current use (e.g., the current random access rate). A given request may, either based on the nature of the request itself or due to external requirements (e.g., as defined by the customer or an administrator of the data storage system), impart an additional random access burden, which may be determined by the optimization engine 804. If the additional random access burden plus the current random access rate of the identity shard associated with the requested archive is above a determined (e.g., predetermined) threshold, such as within n IOPS of the maximum random access capability (or, as another example, above the maximum random access capability altogether), the optimization engine 804 may cause the data storage system to engage additional shards in the retrieval. The determined threshold may depend on whether incoming requests are serviceable by the data storage system (either by the identity shard 814 and/or the other shards 816) within a determined timeframe, such as would be defined by an SLA, as described above. As previously discussed, this may take place by reading the data from the other shards 816 and processing it using the redundancy code so as to regenerate the original data of the requested archives. In some embodiments, the direct retrieval (from the identity shard 814) and the additional retrieval (from the other shards 816) may be executed at least partially in parallel, so as to augment the direct retrieval with that of the additional retrieval.

In some embodiments, the optimization engine 804 may optimize for throughput characteristics and requirements. For example, a given shard (or device associated with the shard) may have a maximum throughput capability. Under operation, in a multitenant system, some amount of the shard's maximum throughput capability will be in current use. A given request may, either based on the nature of the request itself or due to external requirements (e.g., as defined by the customer or an administrator of the data storage system), impart an throughput burden, which may be determined by the optimization engine 804. If the additional throughput burden plus the current throughput in use of the identity shard associated with the requested archive is above a predetermined threshold, the optimization engine 804 may cause the data storage system to engage additional shards in the retrieval. The predetermined threshold may depend on whether incoming requests are serviceable by the data storage system (either by the identity shard 814 and/or the other shards 816) within a specified timeframe, such as would be defined by an SLA, as described above. As previously discussed, this may take place by reading the data from the other shards 816 and processing it using the redundancy code so as to regenerate the original data of the requested archives. In some embodiments, the direct retrieval (from the identity shard 814) and the additional retrieval (from the other shards 816) may be executed at least partially in parallel, so as to augment the direct retrieval with that of the additional retrieval.

In some embodiments, the optimization engine 804 may optimize for minimizing the amount of data transferred between data storage devices, such as data storage facilities. In some of such embodiments, if the incoming requests are serviceable using the associated identity shard 804 within the timeframe, the optimization engine 804 may service the requests directly from the identity shard 804 so as to not engage other shards, thereby minimizing or negating data transfer between data storage devices. In some embodiments, even if the incoming requests are not serviceable within the timeframe using the identity shard 804, other shards stored on the same data storage device that stores the identity shard 804 (e.g., in the vertical column as illustrated) may be used to augment performance, e.g., random access or sequential throughput, if the identity shard 804 is encoded "vertically" within the same data storage device as well as "horizontally" (in the illustrated row). In other words, in some embodiments, other identity shards stored on the same data storage device may be read and processed using the redundancy code so as to generate the original data associated with the requested archive, similarly to the other shards 816 (horizontally). The optimization engine 816 may determine between these modes based on cost, efficiency, SLA, and other factors.

In some embodiments, data transfer may be controlled (e.g., minimized) as between and/or within granular layers of a data storage system. For example, "ring" traffic (e.g., traffic between data storage facilities may be minimized in a given fashion according to the techniques described, while other data transfers, such as between virtual or physical hosts within a given data storage facility, may be controlled in a different fashion. Such layers may be selected along arbitrary lines, such as physically, logically, virtually, geographically, as a function of performance (e.g., random access capability, throughput capability, data security, data and/or media durability, cost associated with retrieval, and the like), etc.

In some embodiments, the optimization engine 804 may optimize retrieval based on locality of the requesting entity, the data storage system generally, the individual data storage devices (and thereby the shards stored thereon), and the like. As geographic proximity plays a role in latency, throughput, availability, and the like, the optimization engine 804 may, in some embodiments, determine whether to process the retrieval request using the identity shard 814 (e.g., if it is relatively close geographically to the requesting entity) or, under certain circumstances, using the other shards (e.g., if the overhead incurred by the processing required to read from the other shards 816 is less than the difficulty, latency, etc., of reading the original data directly from the identity shard 814, such as may be the case if the identity shard 814 is geographically distant from the requestor and the other shards 816 are closer to the requestor).

In some embodiments, the decision making performed by the optimization engine 804 as described may be performed adaptively, e.g., monitoring and/or listening for events related to the various aspects used by the implementing system to determine whether to retrieve the requested archive from the identity shard 814, the other shards 816, or both. In such embodiments, the optimization engine 804 may listen for or detect events, such as device failures or outages, which may change its decision making. Similarly, the optimization engine 804 may monitor various attributes of the data storage devices, such as current random access rate, current throughput usage, device health parameters, network health parameters, and the like, so as to inform its retrieval mode decisions. In some embodiments, the optimization decisions made by the optimization engine 804 may be made in connection with customer requirements, system/environmental factors, or the like, and may be performed as a result of direct action (e.g., in response to a retrieval request), some event associated with the data storage system (e.g., data storage devices going offline or online), or as part of a background process (e.g., "garbage collection" or similar background optimization that is not necessarily associated with a given retrieval or retrieval request).

In some embodiments, in data storage system with a fixed configuration of data storage devices 806, additional shards may be allocated to each data storage device 806 so as to increase the optimizations and benefits just described without, for example, needing to add additional data storage servers or to reprocess already processed data (e.g., without changing the encoding parameters used). As illustrated, two or more shards of a given set 818, 820 may be allocated to each data storage device. As may be contemplated, any number of additional shards may be thus allocated, but as the number of shards in a given set and data storage device increases, the cost of repairing such shards (as well as the likelihood that a shard in the set requires repair) increases. However, the overall optimization benefit increases. In the illustrated example, rather than merely a set of three other shards (e.g. 816) being capable of augmenting a given retrieval (e.g., of an archive associated with identity shard 814), a set of seven may participate in augmentation if the shard sets are doubled, as illustrated. Such multiplication of shard sets may, in some embodiments, be implementing using the cohort techniques previously described.

Figure 9:
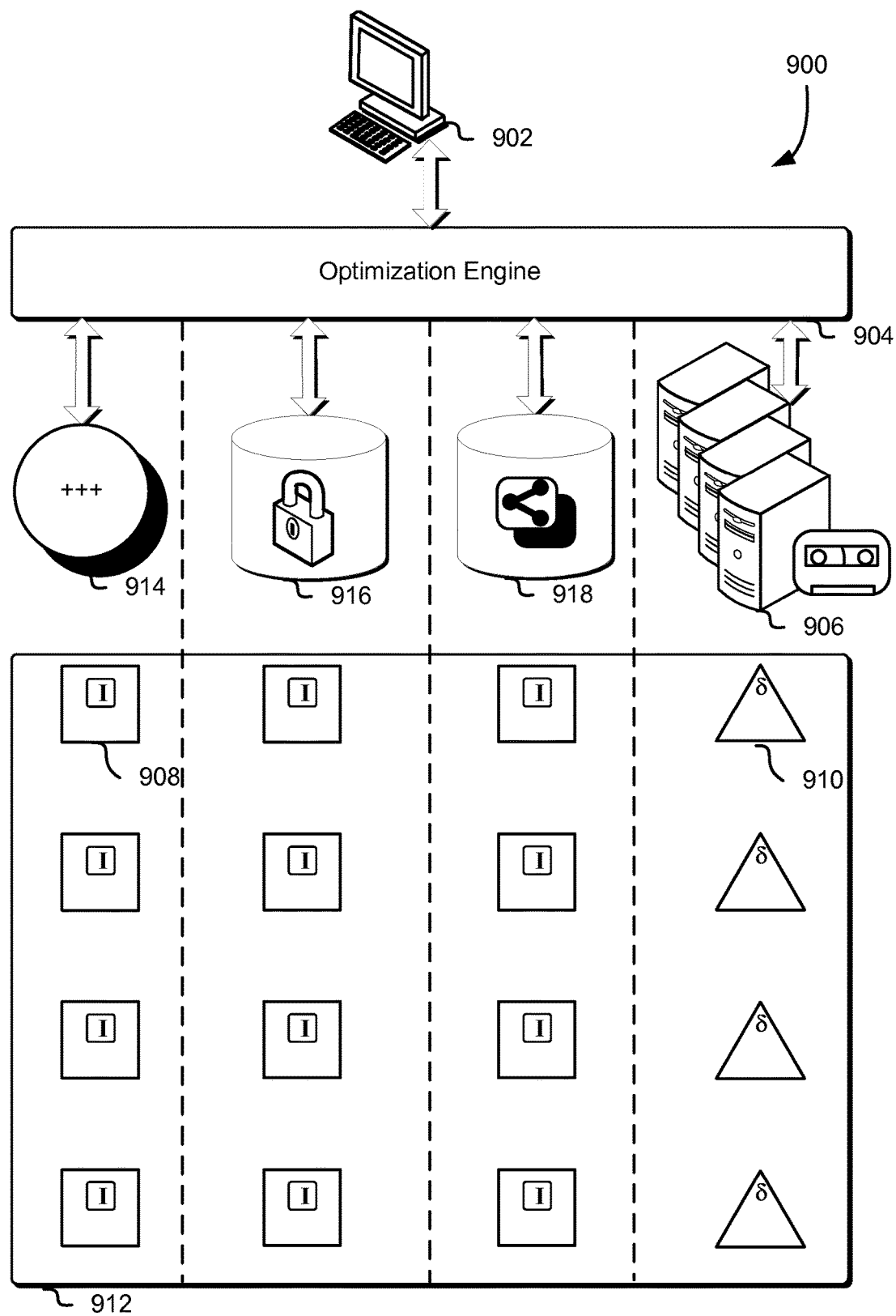
FIG. 9 schematically illustrates various workflows for implementing multiple types of data storage devices for storing redundancy coded data within a given data storage system so as to improve efficiency and/or performance of the data storage system, in accordance with some embodiments.

FIG. 9 schematically illustrates various workflows for implementing multiple types of data storage devices for storing redundancy coded data within a given data storage system so as to improve efficiency and/or performance of the data storage system, in accordance with some embodiments. One or more client entities 902, such as those under control of a customer of a computing resource service provider, submit archive(s) to a data storage system for storage. As previously discussed, the data storage system may be any computing resource or collection of such resources capable of processing data for storage, and interfacing with one or more resources to cause the storage of the processed data. In the illustrated example, the data storage system includes an optimization engine 904 and a plurality of data storage entities 906, 914, 916, 918.

As previously discussed, the optimization engine 904 may be any entity of the data storage system capable of assessing performance requirements of retrieval actions and requests and performance characteristics of the data storage devices. The optimization engine 904 may further assess, based on the aforementioned performance requirements and performance characteristics, a retrieval mode for requested archives that is tailored to such requirements and characteristics, as discussed in further detail herein. The optimization engine 904 may include listener entities, monitoring entities, and the like, so as to detect and/or be notified (e.g., by some other entity) of the aforementioned performance requirements and/or performance characteristics. In some embodiments, the use of listeners and/or monitoring entities enable adaptive selection, e.g, by the optimization engine 904, of the appropriate retrieval mode. In some embodiments, the optimization engine 804 may decide which retrieval mode to use based at least in part on whether the incoming request(s) are capable of being serviced by the data storage system, or components thereof, within a specified timeframe (such as may be defined in a service-level agreement (SLA)). In certain embodiments, the shards 912 may be moved between the various data storage entities 906, 914, 916, 918, and such transfers may be initiated by the optimization engine 904 based on the aforementioned parameters, requirements, and characteristics.

As previously discussed, performance requirements, may either be inherent to the request itself (e.g., as a result of the nature of the request, or that of the data/archives requested), or may be separately defined by, e.g., the requesting customer, an administrator of the data storage system, or the like. Such performance requirements may include requirements related to random access burden incurred by or associated with a request, throughput (e.g., sequential) incurred by or associated with the request, geographic locality (e.g., relative geographic locations of the requestor and the shard(s) hosting the requested data), and the like. Similarly, the performance characteristics of the data storage devices may include random access capacity, random access rate (e.g., a current random access rate for a period of time relative to the point of request), throughput capacity, throughput rate, inter-device data transfer/traffic (e.g., inter-facility data/network transfer/traffic, in the case that the data storage devices are data storage facilities), and the like.

Using techniques described in further detail herein, the data storage system or an entity associated with the data storage system processes the archive using a redundancy code, such as an erasure code, in such a way as to generate a plurality of shards 912 that represent the archives in a partially encoded form. For example, as illustrated, a set of shards (pictured as a horizontal row) may be generated to represent the archive, and the set may include identity shards 908 including the original data of the archive and encoded shards 910 that include derivations of such data. As described in further detail herein, the identity shards 908, by virtue of containing the original data of the archive, may be read directly when retrieving the archives, while the remaining shards, which may include other identity shards (e.g., those containing original data of other archives) and one or more encoded shards 910, may collectively be read, and then processed using the redundancy code so as to recreate the original data of the archive.

As discussed herein, a plurality of archives may be stored in any given identity shard, and multiple identity shards (as well as encoded shards) may be stored on the data storage system. The overall plurality of shards 912 stored on the data storage system may, according to techniques described in further detail herein, be used to optimize various aspects related to the retrieval of archives, as previously mentioned. Such aspects may include operational parameters, such as performance requirements related to the request and/or various components of the data storage system, customer-specified requirements (e.g., of performance), and the like. As may be contemplated, the operational parameters include a variety of axes, a plurality of which may be optimized for at any given time, such as seek rates and burdens, throughputs, timeframes for retrieval (e.g., retrieval times must not exceed a given length of time), locality (e.g., that of the requesting client, the data storage system, the shard(s) associated with the requested archive, or some combination thereof), inter-facility/inter-device data traffic, and the like. Under certain circumstances, each shard of a set representing a given archive may be stored on a different device, device type, or even a different data storage system altogether, so as to more closely match the performance characteristics desired for each shard and/or shard type with that of the storing component and/or entity of the data storage system.

As previously discussed, the data storage devices 906, 914, 916, 918 may include any entities capable of storing data, such as data storage servers, hard drives, tape drives, data storage facilities including multiple storage devices, and the like. As may be contemplated, different types of data storage devices and/or systems may have different characteristics, such as throughput, random access capabilities, durability, reliability, locality, and the like. For example, a data storage device or system with a high throughput or random access capability 914 may be implemented and used for storing identity shards 908 that, e.g., contain archives which are or are expected to be accessed frequently. As another example, a secure data storage device 916, such as a device or system capable of cryptographic routines, may be used to store identity shards containing confidential or sensitive archives. As another example, a high durability data storage device 918 may be used for shards associated with archives requiring moderately frequent or infrequent access, but for which redundancy is paramount. As yet another example, a data storage system implementing tape backup or other sequential access-optimized (or cold storage optimized) devices or media may be used for encoded shards 910, which may not necessarily be accessed unless the identity shards 908 are inaccessible. As may be contemplated, any type of implemented data storage device or system may be used so as to further optimize for the shards and/or archives stored thereon or associated therewith.

Figure 10:
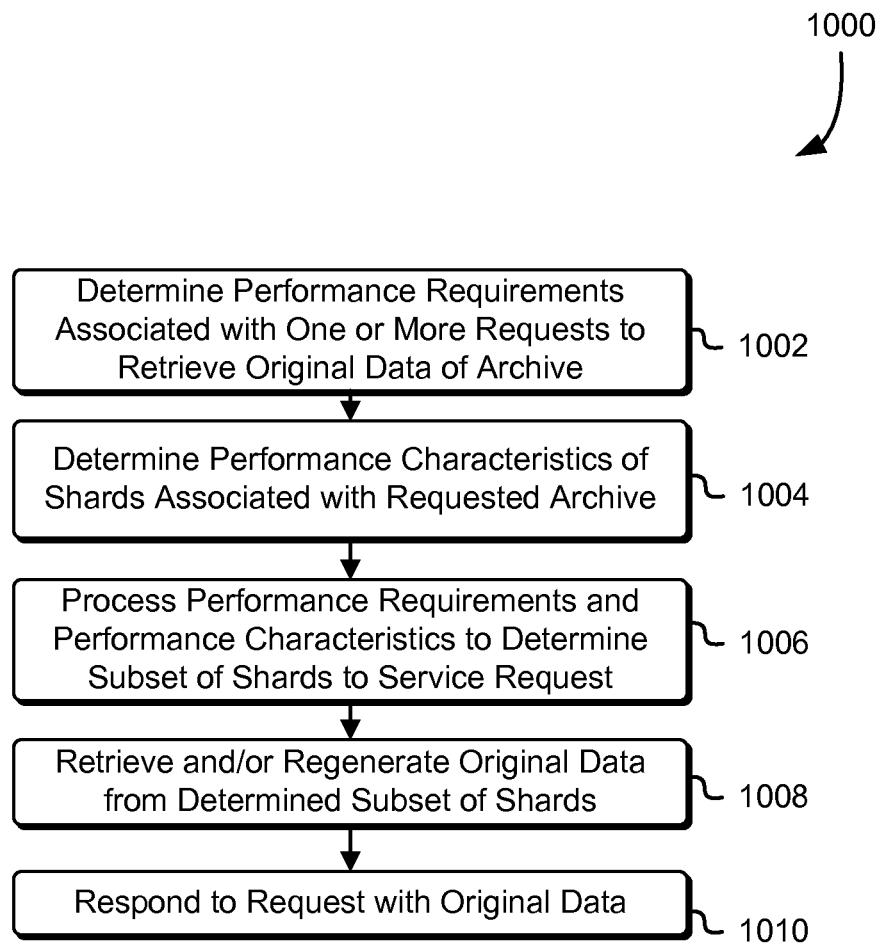
FIG. 10 schematically illustrates an example process for increasing retrieval performance for redundancy coded data by using additional shards, in accordance with some embodiments.

FIG. 10 schematically illustrates an example process for increasing retrieval performance for redundancy coded data by using additional shards, in accordance with some embodiments. At step 1002, an entity, such as an optimization engine as previously described, determines performance requirements associated with one or more requests to retrieve the original data of an archive. As previously discussed, the performance requirements may be defined by the requestor, or may be inherent to the nature of the request itself.

At step 1004, the entity (e.g., optimization engine), determines the performance characteristics of the shards associated with the requested archives. As previously discussed, this may include an assessment of various performance parameters associated with the particular data storage devices associated with the aforementioned shards. In both step 1002 and step 1004, the performance characteristics and requirements, as previously discussed, may include random access requirements/capabilities, throughput, locale, inter-device or inter-facility data traffic, and the like.

At step 1006, the entity (e.g., optimization engine), processes the requirements and characteristics gathered in steps 1002 and 1004 to determine which subset of shards to use to service the request, and at step 1008, the data storage system executes the retrieval according to the determination of step 1006. As mentioned, the retrieval may include direct retrieval from an associated identity shard, a processed retrieval from other shards of the same set, or both (e.g., in parallel). At step 1010, the original data is provided to the requestor, e.g., using an intermediary data store as previously discussed.

Figure 11:
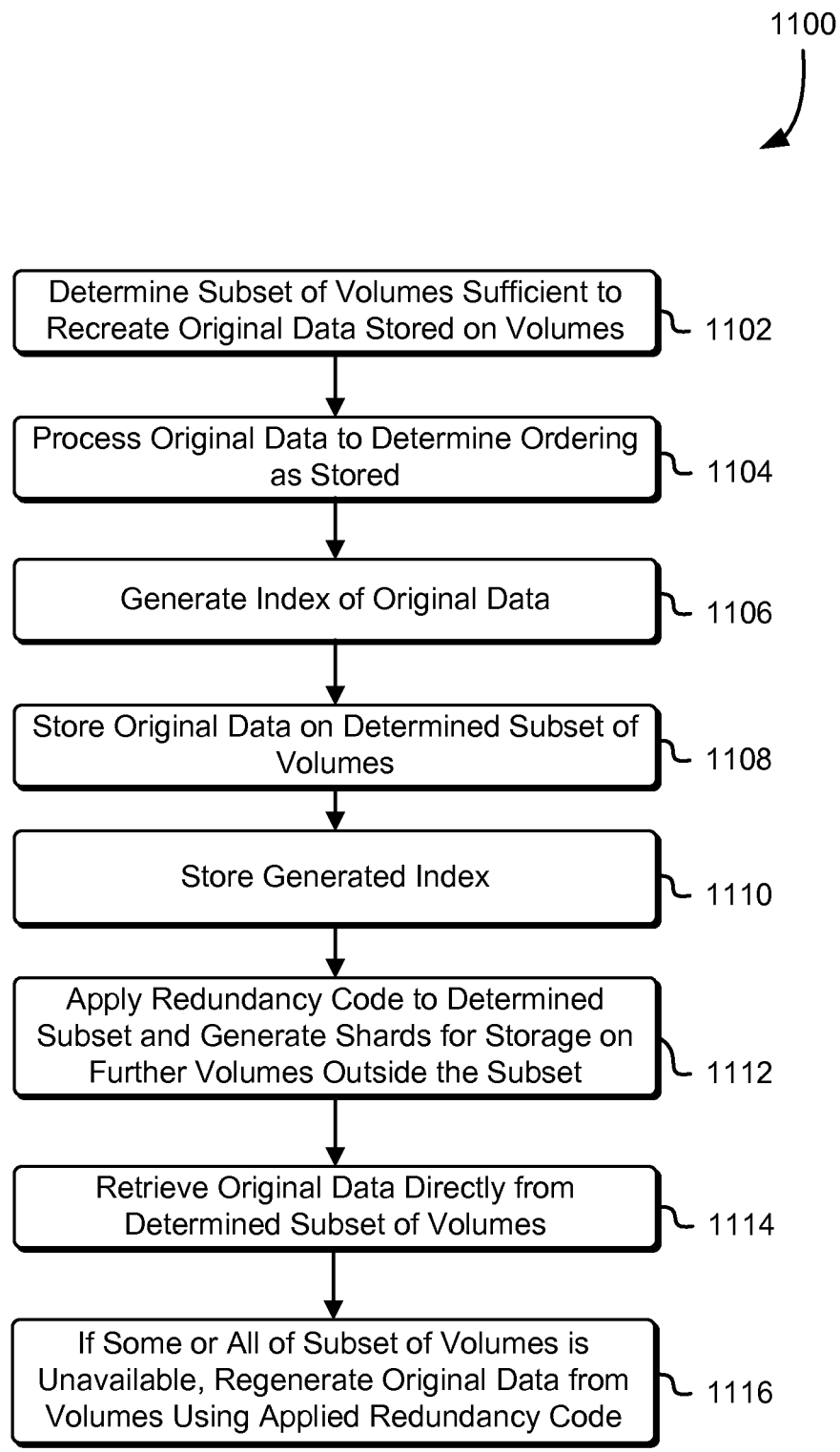
FIG. 11 schematically illustrates an example process for processing, indexing, storing, and retrieving data stored on a data storage system, in accordance with some embodiments.

FIG. 11 schematically illustrates an example process for processing, indexing, storing, and retrieving data stored on a data storage system, in accordance with some embodiments. At step 1102, a resource of a data storage system, such as that implementing a redundancy code to store archives, determines which subset (e.g., quantity) of a plurality of volumes is sufficient, based on, e.g., a redundancy code to be applied to the archives, to recreate the original data to be stored. For example, in accordance with the techniques described above in connection with at least FIGS. 2 and 3, such information may be derived from predetermining the parameters of an erasure code with a specified minimum ratio of shards sufficient to regenerate the original data from which they derive to the total number of shards generated from the application of the erasure code.

At step 1104, original data, such as original data of archives received from customers of, e.g., a data storage system or a computing resource service provider as described in further detail above in connection with at least FIGS. 1-9 above, is sorted by, e.g., the data storage system or associated entity. For example, as previously described, the sort order may be implemented on one or more attributes of the incoming data.

At step 1106, one or more indices, such as sparse indices, are generated by, e.g., the data storage system, for the original data. As previously discussed in connection with at least FIGS. 1 through 9, there may be more than one index for a given volume, and such parallel indices may be of different types depending on the nature of the archives and/or original data being stored.

At step 1108, the original data is stored, e.g., by the data storage system, on the subset of volumes determined in connection with step 1102, and in the order determined in step 1104. Additionally, at step 1110, the index generated in step 1106 is stored, e.g., by the data storage system, on an appropriate entity. As previously discussed, the index may be stored as part of a shard on which the original data is stored, or, in some embodiments, may be stored on a separate resource from that which persists the volume.

At step 1112, the redundancy code is applied, e.g., by the data storage system, to the determined subset of volumes (e.g., shards, as previously discussed in connection with FIGS. 1 through 3), and additional shards containing data derived from the application of the redundancy code are stored on a predetermined quantity of volumes outside the subset determined in connection with step 1102. For example, as previously discussed, the ratio of volumes (e.g., shards) storing the original data to the overall quantity of volumes (including those storing the derived data generated in this step 1112) may be prescribed by the recovery/encoding ratio of the redundancy code applied herein.

At step 1114, in normal operation, requested data may be retrieved, e.g., by the data storage system, directly from the subset of volumes storing the original data, without necessitating retrieval and further processing (e.g., by the redundancy code) from the volumes storing the derived data generated in step 1112. However, at step 1116, if any of the volumes are determined, e.g., by the data storage system, to be unavailable, a replacement shard may be generated by the data storage system by reconstructing the original data from a quorum of the remaining shards, and re-encoding using the redundancy code to generate the replacement shard. As previously discussed in connection with FIGS. 2 through 5, the replacement shard may be the same or different from the shard detected as unavailable.

Figure 12:
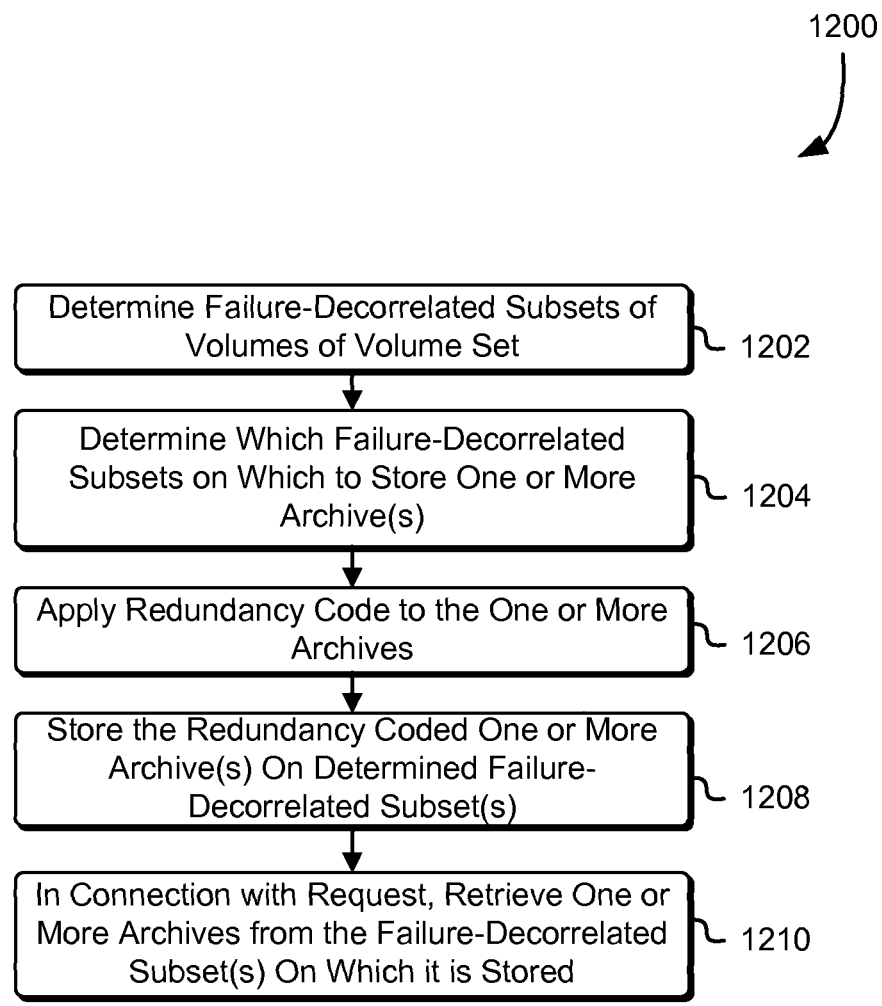
FIG. 12 schematically illustrates an example process for determining failure-decorrelated volume subsets and storing/retrieving data thereto, in accordance with some embodiments.

FIG. 12 schematically illustrates an example process for determining failure-decorrelated volume subsets and storing/retrieving data thereto, in accordance with some embodiments. At step 1202, the quantity, configuration, and/or size of failure-decorrelated subsets of a volume set are determined by, e.g., an implementing data storage system or computing resource service provider as described below. As mentioned in connection with at least FIG. 4, such quantity, configuration, and/or size of failure-decorrelated subsets may be tuned and/or adjusted according to the system characteristics desired. Also as mentioned, the number of cohorts from which a given failure-decorrelated subset is selected may also be adjusted or adjustable as necessary.

At step 1204, the system determines which failure-decorrelated subset(s) to store archives incoming to the system. As previously mentioned, the determination may be made on any appropriate basis, such as using the attributes of the incoming archives, attributes of the volumes and/or the failure-decorrelated subset(s), and the like.

At step 1206, a redundancy code, such as a forward error correction code or erasure code, may be applied to the archives by the system. As previously discussed, such application may be made prior to, after, or in connection with the storage of original data of the archives to be stored (and in some embodiments, may result generation of shards of derived data as well as shards of original data.

At step 1208, some or all of the results of the encoding of step 1206 are stored by the system on an appropriate failure-decorrelated subset for the given archive as determined in steps 1202 and 1204. As mentioned, in some embodiments, such storage may be performed using volume-encoding techniques, and thus the original data may be directly stored and/or retrieved from some or all of the volumes without necessitating decoding unless such volumes become unavailable.

At step 1210, in connection with, e.g., a request from an owner or customer of the stored archives, the system locates the appropriate failure-decorrelated subset and retrieves the archives. The manner in which the system locates the appropriate failure-decorrelated subset may differ depending on how such failure-decorrelated subsets (and archives) are apportioned. For example, if the sequence of failure-decorrelated subsets is predetermined and keyed to a given attribute of the archive, the archive attribute may be used to identify which of the failure-decorrelated subsets is storing the data.

Figure 13:
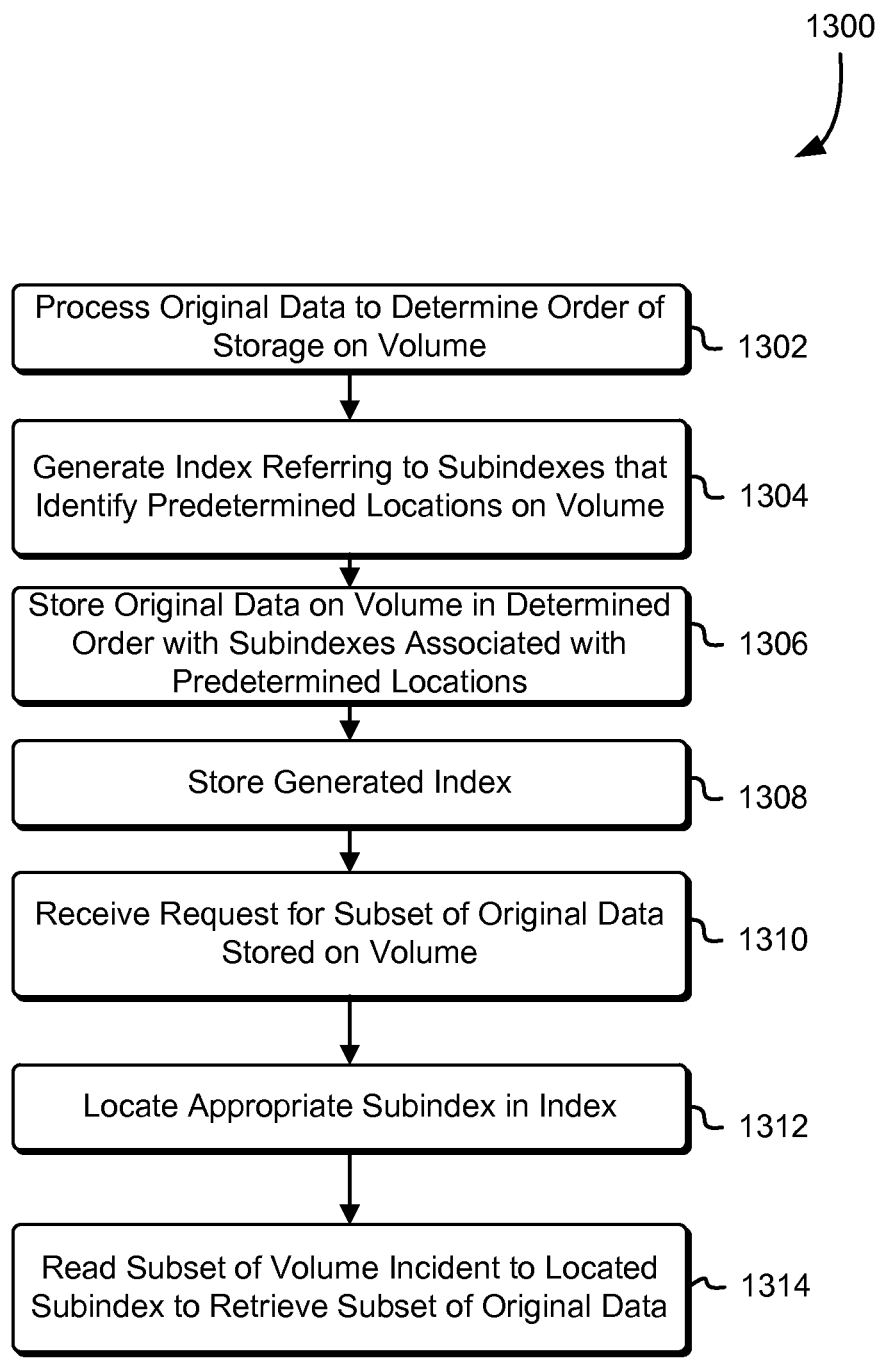
FIG. 13 schematically illustrates an example process for indexing original data stored on a redundancy coded data storage system, in accordance with some embodiments.

FIG. 13 schematically illustrates an example process for indexing original data stored on a redundancy coded data storage system, in accordance with some embodiments. At step 1302, similarly to step 1104 of process 1100 described in connection with FIG. 11, original data is processed by, e.g., a data storage system, to determine the order of storage of archives containing the original data on a volume. Information regarding the sort order may be persisted on, e.g., the volume, or a separate entity from the volume, as discussed above.

At step 1304, one or more indices, such as sparse indices, are generated by, e.g., the data storage system, and point to subindexes that identify predetermined locations on the volume. The locations may be predetermined based on the parameters of the specific implementation, such as the size of the volume, the speed of reading and/or writing the volume (e.g., sequentially), the number of archives per volume, and the like. As previously discussed, the subindexes may be abstractions, or, in some embodiments, may be data or metadata elements stored on or in connection with the volume.

At step 1306, the original data sorted in step 1302 is stored by the data storage system on the volume, with subindexes associated with, pointing to, or stored at predetermined locations mentioned in step 1304. The index generated in step 1304 is stored, at step 1308, by the data storage system on a resource associated with volume, or, in some embodiments, on the volume itself, according to the techniques described above.

At step 1310, a request, such as from a client entity or other entity connected to the data storage system and/or the volume, for a subset of the original data stored on the volume, is received by the volume or the data storage system associated with the volume. The data storage system and/or the requesting entity may, as previously discussed, have access to information regarding the sort order of the original data as determined in step 1302, and, in embodiments utilizing sparse indexes, may use the index to locate an appropriate subindex at step 1312. As previously discussed, in some embodiments, the appropriate subindex is the nearest location, marked by the subindex, that is sequentially prior to the requested subset of original data as stored on the volume. Once the subindex is determined in step 1312, at step 1314, the volume is sequentially read (e.g., by the data storage system or the storage device on which the volume is implemented) from the location denoted by the appropriate subindex, until the requested subset of original data is located and retrieved.

Figure 14:
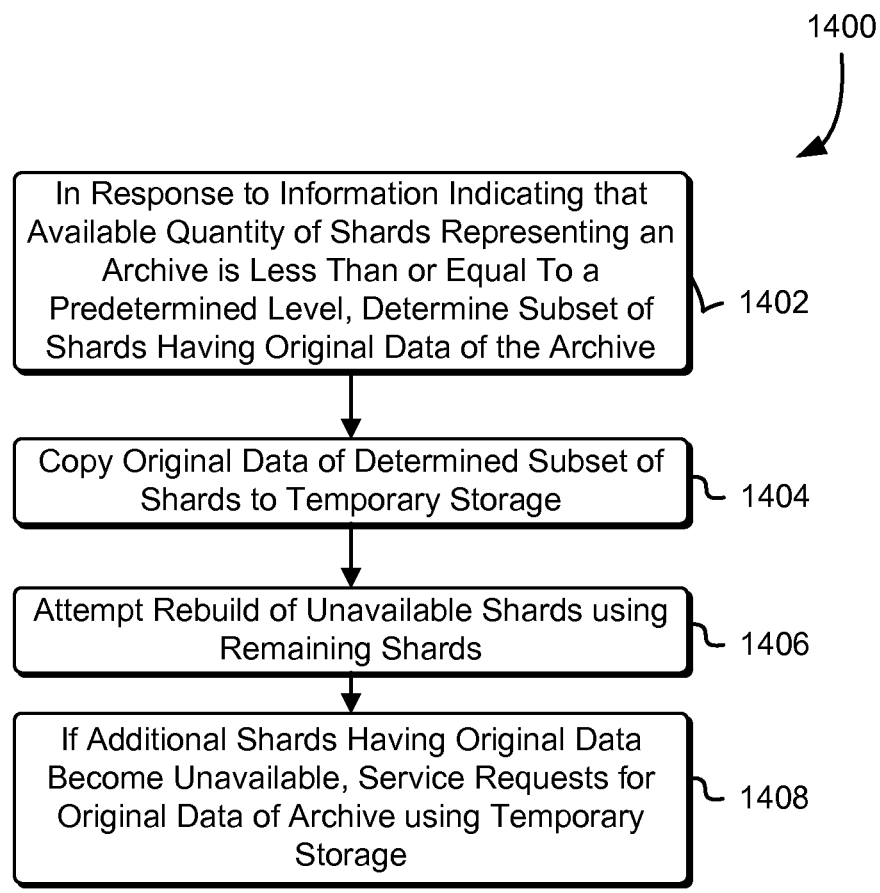
FIG. 14 schematically illustrates an example process for mitigating data loss in redundancy coded data, in accordance with some embodiments.

FIG. 14 schematically illustrates an example process for mitigating data loss in redundancy coded data, in accordance with some embodiments. At step 1402, in response to receiving information indicating that an available quantity of shards representing one or more archives is less than, equal to, or approaching a predetermined level, an entity associated with the data storage system responsible for the associated shards determines which subset of the shards includes the unencoded, original data associated with the one or more archives. As previously discussed, the entity may include a listener or other type of resource capable of monitoring the whereabouts and/or status of the shards. The subset of the shards determined in this step 1402 may include one or more groups of shards that include identity shards. The predetermined level may be set in advance, determined dynamically, and/or adjusted manually, and may be predetermined in connection with one or more minimum quorum quantities of one or more groups of shards associated with the archive(s).

At step 1404, the subset of shards determined in step 1402 is copied to a storage entity associated with the data storage system. As previously discussed, the storage entity may be a storage device, a storage service, a cache, or other resource capable of at least temporarily storing the data. In some embodiments, also as previously discussed, the storage entity may be configured such that it is capable of "standing in" or otherwise temporarily replacing one or more components or resources used by the data storage system in ordinary data retrieval and storage operations.

At step 1406, the data storage system or associated resource(s) attempt to regenerate, using techniques described elsewhere in this disclosure, the unavailable shards associated with the archive(s). In some embodiments, the regeneration of this step 1406 may be performed in parallel with the copying operation of step 1404. In some embodiments, however, the copying process of step 1404 may be prioritized, either temporally or by allocation of system resources dedicated to related operations, so as to minimize the chance that additional shards and/or original data are lost after the information is received in step 1402.

At step 1408, in the cases where the original data becomes unavailable (e.g., the shards having such original data become unavailable) during any of the preceding steps 1402-1406, some or all of the requests associated with the archive(s) associated with that original data are directed to the temporary storage to which the original data was copied in step 1404, if the original data was successfully copied. In some embodiments, all requests for the original data are redirected to the temporary storage until such time as the quantity of shards representing such original data has been restored to a level equal to or above the predetermined level mentioned in connection with step 1402.

Figure 15:
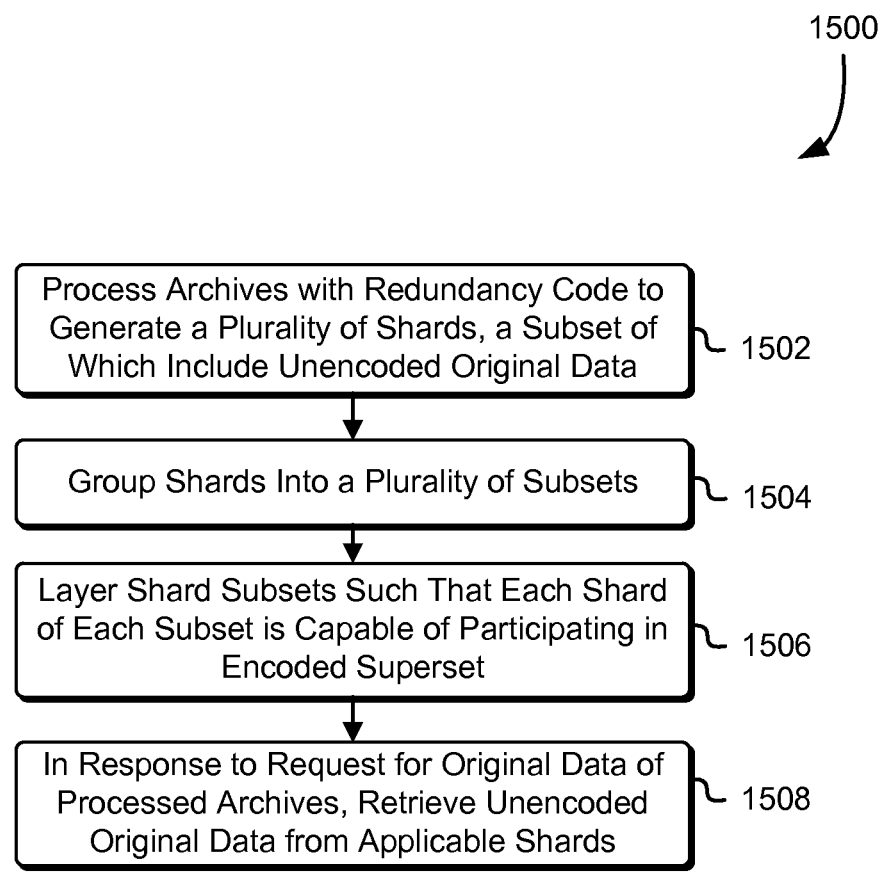
FIG. 15 schematically illustrates an example process for layering redundancy coded data, in accordance with some embodiments.

FIG. 15 schematically illustrates an example process for layering redundancy coded data, in accordance with some embodiments. At step 1502, a resource of an implementing data storage system, such as that implementing a redundancy code to store archives, processes incoming archives (such as those received from a customer of, e.g., a data storage system or a computing resource service provider as described in further detail above in connection with at least FIGS. 1-14) to generate a plurality of shards. As previously discussed, the shards may be generated such that a subset includes unencoded original data of the archives (e.g., identity shards), while other shards include encoded forms of such data, such as may be generated by application of a redundancy code.

At step 1504, a resource of the data storage system, such as the same or different resource that generated the shard(s) in the first instance, groups shards into a plurality of subsets (groups). As previously discussed, some or all of the groups of shards may be configured such that as long as a minimum quorum quantity of shards remain in a given group, unavailable shards with that group may be regenerated using the available shards with that group. In some embodiments, as previously discussed, some groups may include doubly derived shards, such as may be the case if a group is generated in connection with another group (e.g. a group of parity shards associated with an erasure coded group).

At step 1506, the shard subsets (groups) are layered by a resource of the data storage system such that shards in disparate groups may participate in regeneration of at least some of the shards outside of the group to which it immediately belongs. As previously discussed, such layering may enable otherwise unavailable groups of shards to be regenerated using shards of other groups.

At step 1508, in response to a request, e.g., of a customer to which a given archive belongs, for original data processed and stored in accordance with steps 1502-1506 above, the original data may directly be retrieved, e.g., from the identity shards bearing the unencoded original data. As such, such retrieval requests may be serviced in a way that only groups including the relevant identity shards need be retrieved and processed, thereby increasing efficiency of retrieval of the data.

Figure 16:
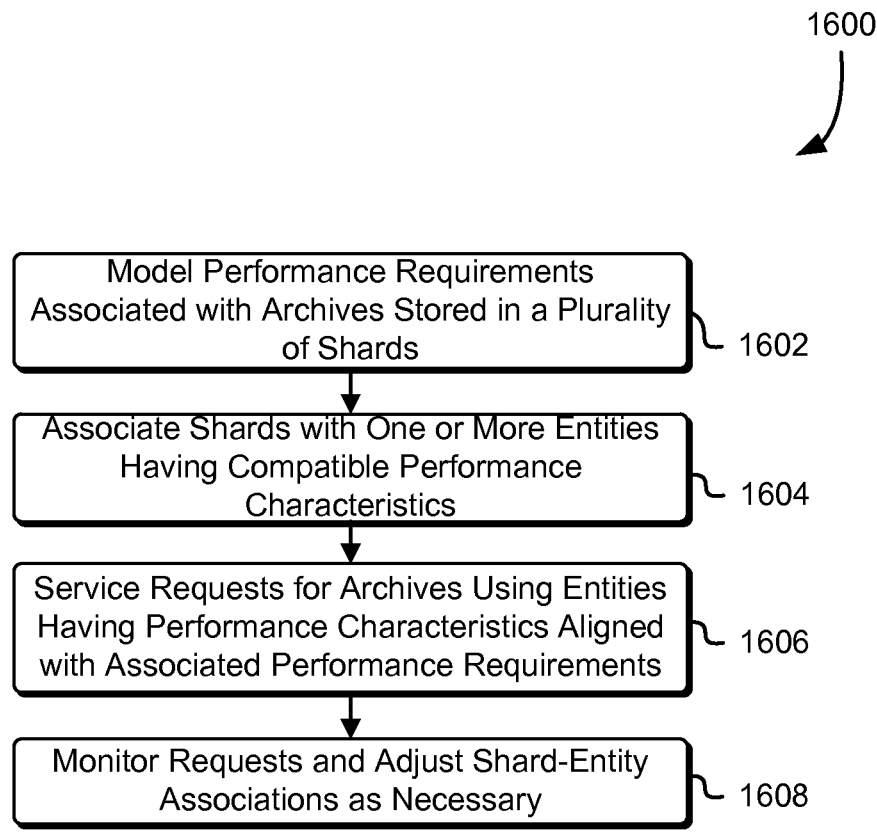
FIG. 16 schematically illustrates an example process for adaptively using optimum entities for servicing data retrieval requests, in accordance with some embodiments.

FIG. 16 schematically illustrates an example process for adaptively using optimum entities for servicing data retrieval requests, in accordance with some embodiments. At step 1602, an entity, such as an optimization engine as previously discussed, models performance requirements associated with archives stored, or to be stored, in a plurality of shards (such as would be generated by application of a redundancy code). As previously discussed, the archives represented in the shards may be differentiated by several parameters, such as security requirements, frequency of access, volume of access, and the like, and the shards may thereby also inherit such performance requirements (if identity shards are used).

At step 1604, the differentiation mentioned in connection with step 1602 is executed, e.g., by the optimization engine, and the associated shards are associated with entities, e.g., data storage devices, having compatible performance characteristics. For example, highly accessed archives may have associated identity shards stored in a high performance data store.

At step 1606, incoming requests for retrieval of the stored archives is performed using the most optimal shard or set of shards, as determined by, e.g., the optimization engine. As previously discussed, in certain cases, direct retrieval may not necessarily be the optimal retrieval mode. Such requests are monitored at step 1608, e.g., by the optimization engine, and the associations between the entities (data storage devices, for example) and the shards stored thereon and/or associated therewith may be updated accordingly.

Figure 17:
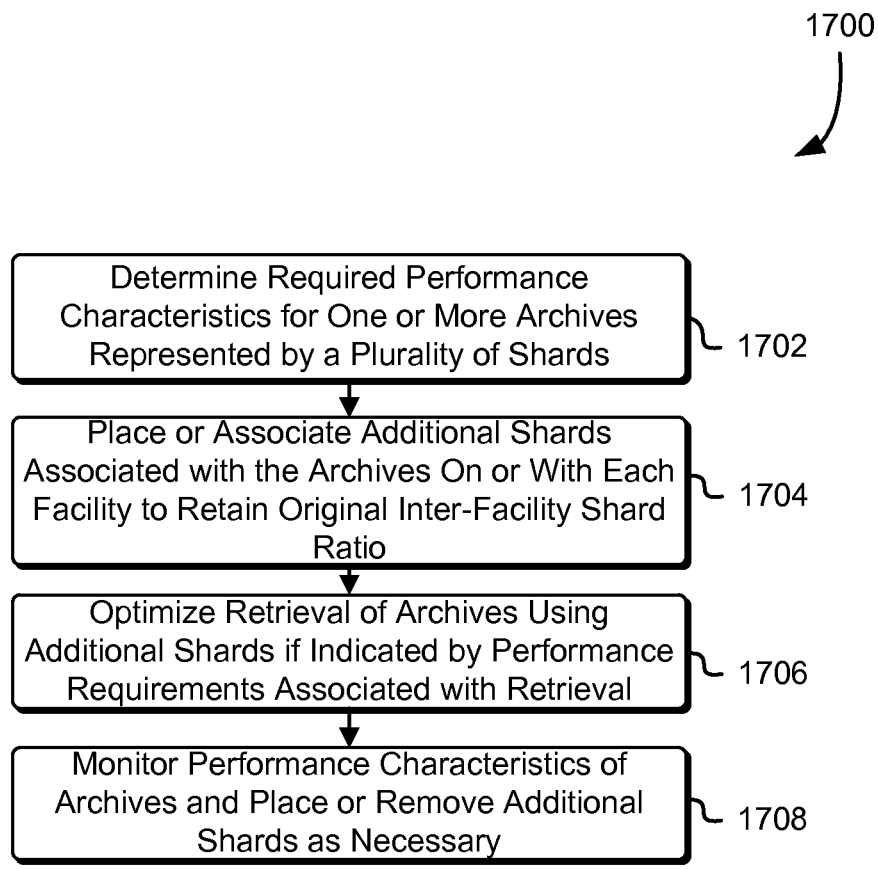
FIG. 17 schematically illustrates an example process for improving data retrieval performance using additional shards without expanding certain other parameters of a data storage system, in accordance with some embodiments.

FIG. 17 schematically illustrates an example process for improving data retrieval performance using additional shards without expanding certain other parameters of a data storage system, in accordance with some embodiments. At step 1702, an entity, such as an optimization engine as previously discussed, determines (and, in some cases, receives) performance characteristics and/or requirements associated with archives stored on a data storage system and represented by a plurality of shards. The data storage system, as previously discussed, may include a fixed device configuration, and in some cases the encoding (e.g., by the redundancy code) used on the archives to generate the shards is set in accordance with the fixed device configuration.

At step 1704, based on the determination in step 1702, the optimization engine places or otherwise associates additional shards to each entity to which a shard is already associated. In some embodiments, the number of shards allocated to a given entity is equal as between other entities in a given system (e.g., may be a multiple of the number of data storage devices in the system). As a result, the original inter-facility (or inter-device) ratio is preserved; as previously discussed, no adjustment of the encoding or the configuration of the data storage devices is required.

At step 1706, archive retrieval is optimized by, e.g., the optimization engine, according to processes 1000 and 1600, and similarly, the performance characteristics associated with the archives are monitored (e.g., according to the techniques previously discussed) so as to continuously add or remove the additionally allocated shards (e.g., at step 1704) as necessitated by the performance requirements monitored in step 1708.

Figure 18:
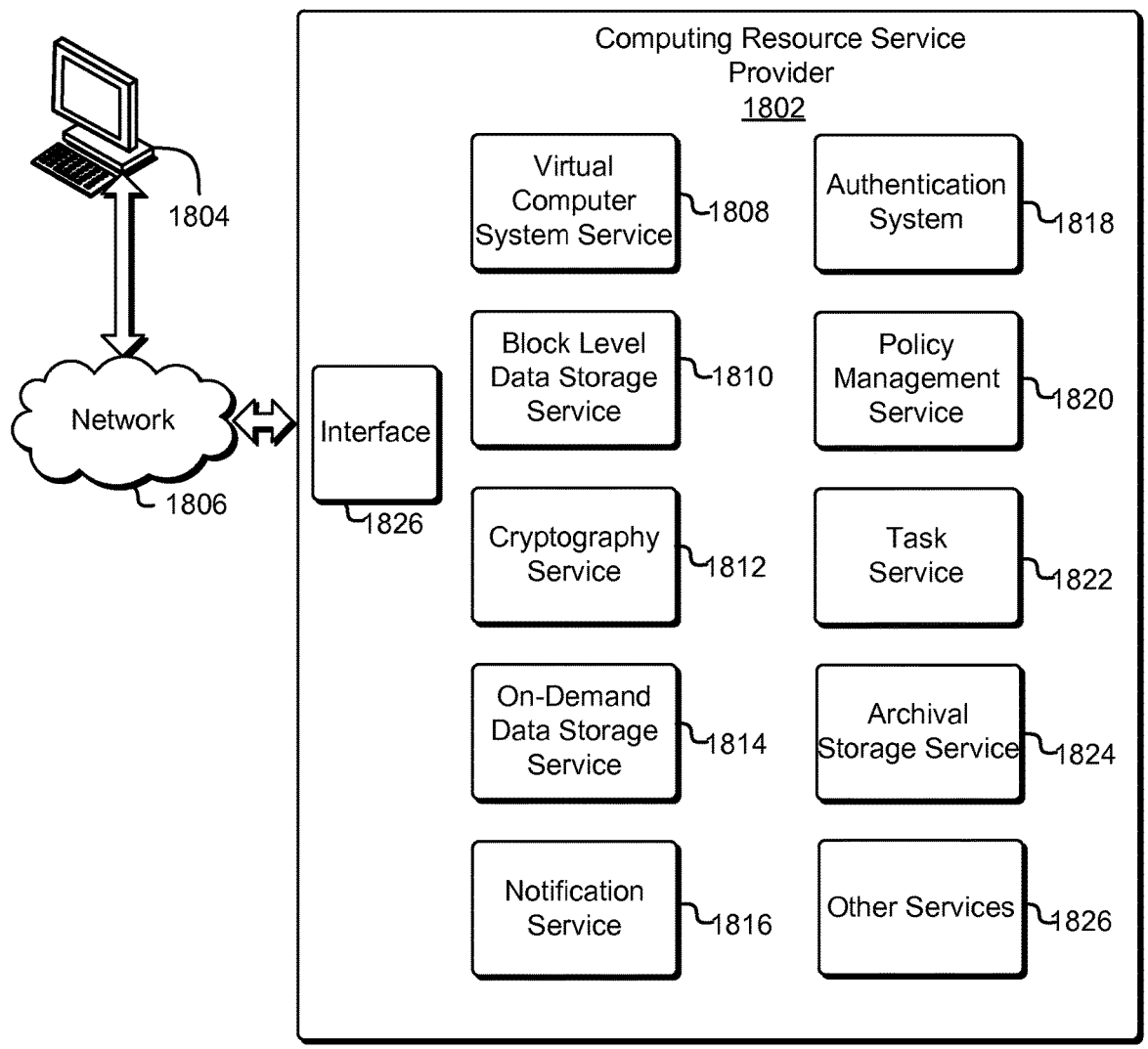
FIG. 18 schematically illustrates an environment, including a computing resource service provider, in which data storage and indexing techniques may be implemented, in accordance with some embodiments.

FIG. 18 shows an example of a customer connected to a computing resource service provider in accordance with at least one embodiment. The computing resource service provider 1802 may provide a variety of services to the customer 1804 and the customer 1804 may communicate with the computing resource service provider 1802 via an interface 1826, which may be a web services interface or any other type of customer interface. While FIG. 18 shows one interface 1826 for the services of the computing resource service provider 1802, each service may have its own interface and, generally, subsets of the services may have corresponding interfaces in addition to or as an alternative to the interface 1826. The customer 1804 may be an organization that may utilize one or more of the services provided by the computing resource service provider 1802 to maintain and deliver information to its employees, which may be located in various geographical locations. Additionally, the customer 1804 may be an individual that utilizes the services of the computing resource service provider 1802 to deliver content to a working group located remotely. As shown in FIG. 18, the customer 1804 may communicate with the computing resource service provider 1802 through a network 1806, whereby the network 1806 may be a communication network, such as the Internet, an intranet or an Internet service provider (ISP) network. Some communications from the customer 1804 to the computing resource service provider 1802 may cause the computing resource service provider 1802 to operate in accordance with one or more embodiments described or a variation thereof.

The computing resource service provider 1802 may provide various computing resource services to its customers. The services provided by the computing resource service provider 1802, in this example, include a virtual computer system service 1808, a block-level data storage service 1810, a cryptography service 1812, an on-demand data storage service 1814, a notification service 1816, an authentication system 1818, a policy management service 1820, a task service 1822 and one or more other services 1824. It is noted that not all embodiments described include the services 1808-1824 described with reference to FIG. 18 and additional services may be provided in addition to or as an alternative to services explicitly described. As described, each of the services 1808-1824 may include one or more web service interfaces that enable the customer 1804 to submit appropriately configured API calls to the various services through web service requests. In addition, each of the services may include one or more service interfaces that enable the services to access each other (e.g., to enable a virtual computer system of the virtual computer system service 1808 to store data in or retrieve data from the on-demand data storage service 1814 and/or to access one or more block-level data storage devices provided by the block level data storage service 1810).

The virtual computer system service 1808 may be a collection of computing resources configured to instantiate virtual machine instances on behalf of the customer 1804. The customer 1804 may interact with the virtual computer system service 1808 (via appropriately configured and authenticated API calls) to provision and operate virtual computer systems that are instantiated on physical computing devices hosted and operated by the computing resource service provider 1802. The virtual computer systems may be used for various purposes, such as to operate as servers supporting a website, to operate business applications or, generally, to serve as computing power for the customer. Other applications for the virtual computer systems may be to support database applications, electronic commerce applications, business applications, and/or other applications. Although the virtual computer system service 1808 is shown in FIG. 18, any other computer system or computer system service may be utilized in the computing resource service provider 1802, such as a computer system or computer system service that does not employ virtualization or instantiation and instead provisions computing resources on dedicated or shared computers/servers and/or other physical devices.

The block-level data storage service 1810 may comprise one or more computing resources that collectively operate to store data for a customer 1804 using block-level storage devices (and/or virtualizations thereof). The block-level storage devices of the block-level data storage service 1810 may, for instance, be operationally attached to virtual computer systems provided by the virtual computer system service 1808 to serve as logical units (e.g., virtual drives) for the computer systems. A block-level storage device may enable the persistent storage of data used/generated by a corresponding virtual computer system where the virtual computer system service 1808 may only provide ephemeral data storage.

The computing resource service provider 1802 also includes a cryptography service 1812. The cryptography service 1812 may utilize one or more storage services of the computing resource service provider 1802 to store keys of the customers in encrypted form, whereby the keys may be usable to decrypt customer 1812 keys accessible only to particular devices of the cryptography service 1812.

The computing resource service provider 1802 further includes an on-demand data storage service 1814. The on-demand data storage service 1814 may be a collection of computing resources configured to synchronously process requests to store and/or access data. The on-demand data storage service 1814 may operate using computing resources (e.g., databases) that enable the on-demand data storage service 1814 to locate and retrieve data quickly, to allow data to be provided in responses to requests for the data. For example, the on-demand data storage service 1814 may maintain stored data in a manner such that, when a request for a data object is retrieved, the data object can be provided (or streaming of the data object can be initiated) in a response to the request. As noted, data stored in the on-demand data storage service 1814 may be organized into data objects. The data objects may have arbitrary sizes except, perhaps, for certain constraints on size. Thus, the on-demand data storage service 1814 may store numerous data objects of varying sizes. The on-demand data storage service 1814 may operate as a key value store that associates data objects with identifiers of the data objects that may be used by the customer 1804 to retrieve or perform other operations in connection with the data objects stored by the on-demand data storage service 1814.

In the environment illustrated in FIG. 18, a notification service 1816 is included. The notification service 1816 may comprise a collection of computing resources collectively configured to provide a web service or other interface and browser-based management console. The management console can be used to configure topics for which customers seek to receive notifications, configure applications (or people), subscribe clients to the topics, publish messages, or configure delivery of the messages over clients' protocol of choice (i.e., hypertext transfer protocol (HTTP), e-mail and short message service (SMS), among others). The notification service 1816 may provide notifications to clients using a "push" mechanism without the need to check periodically or "poll" for new information and updates. The notification service 1816 may further be used for various purposes such as monitoring applications executing in the virtual computer system service 1808, workflow systems, time-sensitive information updates, mobile applications, and many others.

As illustrated in FIG. 18, the computing resource service provider 1802, in various embodiments, includes an authentication system 1818 and a policy management service 1820. The authentication system 1818, in an embodiment, is a computer system (i.e., collection of computing resources) configured to perform operations involved in authentication of users of the customer. For instance, one of the services 1808-1816 and 1820-1824 may provide information from a user to the authentication system 1818 to receive information in return that indicates whether the user requests are authentic.

The policy management service 1820, in an embodiment, is a computer system configured to manage policies on behalf of customers (such as customer 1804) of the computing resource service provider 1802. The policy management service 1820 may include an interface that enables customers to submit requests related to the management of policy. Such requests may, for instance, be requests to add, delete, change, or otherwise modify policy for a customer or for other administrative actions, such as providing an inventory of existing policies and the like.

The computing resource service provider 1802, in various embodiments, is also equipped with a task service 1822. The task service 1822 is configured to receive a task package from the customer 1804 and enable executing tasks as dictated by the task package. The task service 1822 may be configured to use any resource of the computing resource service provider 1802, such as one or more instantiated virtual machines or virtual hosts, for executing the task. The task service 1824 may configure the one or more instantiated virtual machines or virtual hosts to operate using a selected operating system and/or a selected execution application in accordance with a requirement of the customer 1804.

The computing resource service provider 1802 additionally maintains one or more other services 1824 based at least in part on the needs of its customers 1804. For instance, the computing resource service provider 1802 may maintain a database service for its customers 1804. A database service may be a collection of computing resources that collectively operate to run one or more databases for one or more customers 1804. The customer 1804 may operate and manage a database from the database service by utilizing appropriately configured API calls. This, in turn, may allow a customer 1804 to maintain and potentially scale the operations in the database. Other services include, but are not limited to, object-level archival data storage services, services that manage and/or monitor other services.

The computing resource service provider 1802 further includes an archival storage service 1824. The archival storage service 1824 may comprise a collection of computing resources that collectively operate to provide storage for data archiving and backup of customer data. The data may comprise one or more data files that may be combined to form an archive. The archival storage service 1824 may be configured to persistently store data that may be infrequently accessed and for which long retrieval times are acceptable to a customer utilizing the archival storage service 1824. A customer may interact with the archival storage service 1824 (for example, through appropriately configured API calls made to the archival storage service 1824) to generate one or more archives, upload and retrieve the one or more archives or monitor the generation, upload or retrieval of the one or more archives.

The computing resource service provider 1802 additionally maintains one or more other services 1826 based at least in part on the needs of its customers 1804. For instance, the computing resource service provider 1802 may maintain a database service for its customers 1804. A database service may be a collection of computing resources that collectively operate to run one or more databases for one or more customers 1804. The customer 1804 may operate and manage a database from the database service by utilizing appropriately configured API calls. This, in turn, may allow a customer 1804 to maintain and potentially scale the operations in the database. Other services include, but are not limited to, object-level archival data storage services, services that manage and/or monitor other services.

Figure 19:
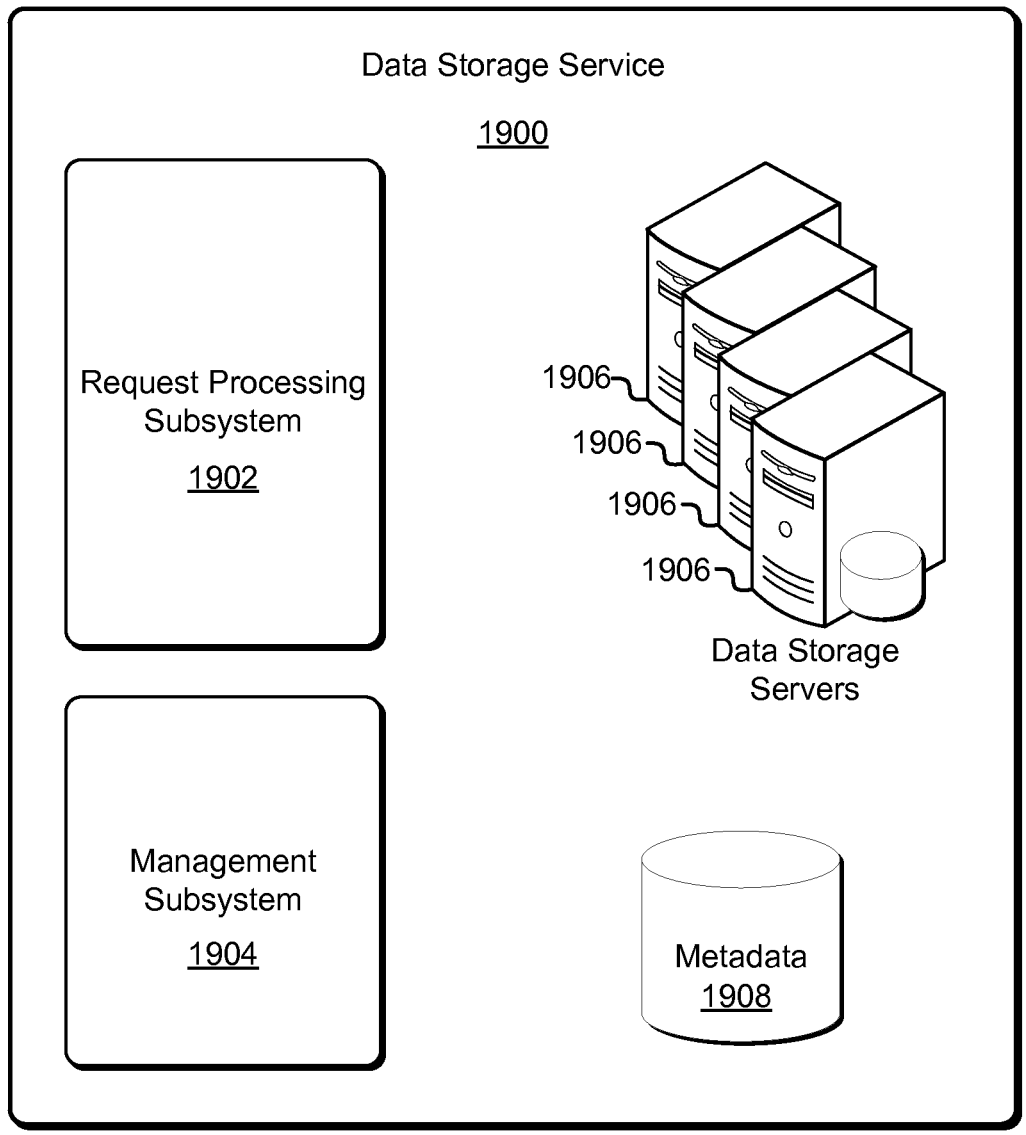
FIG. 19 schematically illustrates a data storage service capable of implementing various data storage and indexing techniques, in accordance with some embodiments.

FIG. 19 shows an illustrative example of a data storage service in accordance with various embodiments. The data storage service 1900 may be a service of a computing resource provider used to operate an on-demand data storage service such as described above in connection with FIG. 18. As illustrated in FIG. 19, the data storage service 1900 includes various subsystems such as a request processing subsystem 1902 and a management subsystem 1904. The data storage service 1900 may also include a plurality of data storage servers 1906 and a metadata storage 1908, which may store metadata about various data objects stored among the data storage servers 1906 as described. In an embodiment, the request processing subsystem 1902 is a collection of computing resources, such as webservers and application servers, collectively configured to process requests submitted to the data storage service 1900. The request processing subsystem 1902, for example, may include one or more webservers that provide a web service interface to enable customers of the data storage service 1900 to submit requests to be processed by the data storage service 1900. The request processing subsystem 1902 may include computers systems configured to make various determinations in connection with the processing of requests, such as whether policy allows fulfillment of a request, whether requests are authentic (e.g., electronically signed using a suitable cryptographic key) and otherwise.

Components of the request processing subsystem may interact with other components of the data storage service 1900 (e.g., through network communications). For example, some requests submitted to the request processing subsystem 1902 may involve the management of computing resources which may include data objects stored by the data storage servers 1906. The request processing subsystem 1902, for example, may receive and process requests to modify computing resources. For instance, in some examples, data objects are logically organized into logical data containers. Data objects associated with a logical data container may, for example, be said to be in the logical data container. Requests to the data processing subsystem 1902 may include requests for creating logical data containers, deleting logical data containers, providing an inventory of a logical data container, providing or updating access control policy with respect to one or more logical data containers and the like.

The requests may be processed by the management subsystem 1904 upon receipt by the request processing subsystem 1902. If applicable, various requests processed by the request processing subsystem 1902 and/or management subsystem 1904, may result in the management subsystem 1904 updating metadata associated with data objects and logical data containers stored in the metadata store 1908. Other requests that may be processed by the request processing subsystem 1902 include requests to perform operations in connection with data objects. The requests, for example, may include requests to upload data objects to the data storage service 1900, to download data objects from the data storage service 1900, to delete data objects stored by the data storage service 1900 and/or other operations that may be performed.

Requests processed by the request processing subsystem 1902 that involve operations on data objects (upload, download, delete, e.g.) may include interaction between the request processing subsystem 1902 and one or more data storage servers 1906. The data storage servers 1906 may be computer system communicatively coupled with one or more storage devices for the persistent of data objects. For example, in order to process a request to upload a data object, the request processing subsystem may transmit data to a data storage server 1906 for persistent storage. It is noted, however, that in some embodiments, client (e.g., customer) computer systems may transmit data directly to the data storage servers 1906 instead of through severs in the request processing subsystem.

In some embodiments, the request processing subsystem 1902 transmits data to multiple data storage servers 1906 for the purposes of redundantly storing the data to allow the retrievability of data in the event of failure of an individual data storage server 1906 and/or associated data storage device. For example, in some embodiments, the request processing subsystem uses a redundancy in coding scheme such as erasure coding to deconstruct a data object into multiple parts that are stored among the data storage servers 1906. The parts may be configured such that if access to a certain number of parts is lost, the data object may nevertheless be reconstructible from the remaining parts that remain accessible.

To enable efficient transfer of data between the request processing subsystem 1902 and the data storage servers 1906 and/or generally to enable quick processing of requests, the request processing subsystem 1902 may include one or more databases that enable the location of data among the data storage servers 1906. For example, the request processing subsystem 1902 may operate a key value store that serves to associate identifiers of data objects with locations among the data storage servers 1906 for accessing data of the data objects.

Figure 20:
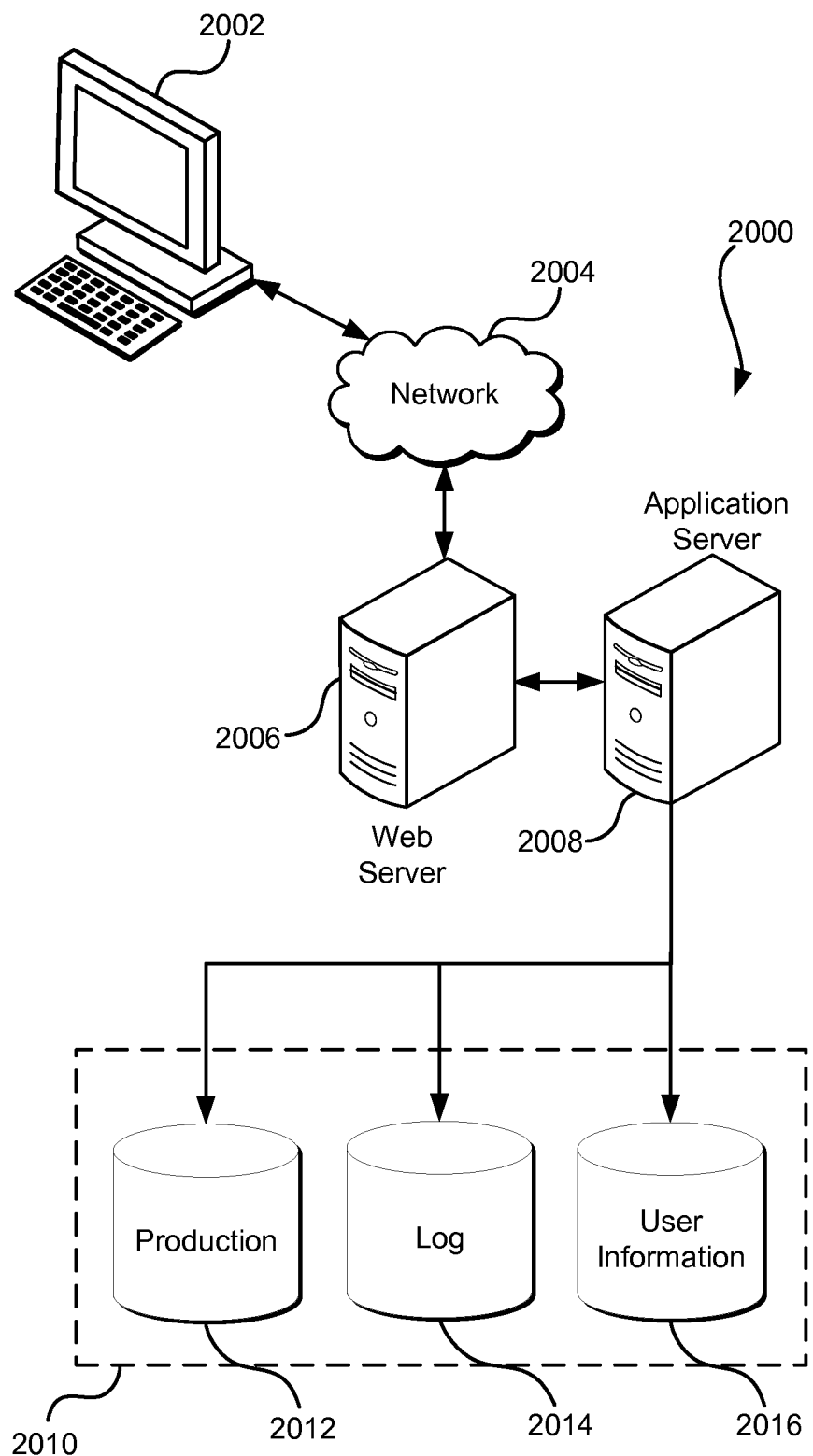
FIG. 20 illustrates an environment in which various embodiments can be implemented.

FIG. 20 illustrates aspects of an example environment 2000 for implementing aspects in accordance with various embodiments. As will be appreciated, although a web-based environment is used for purposes of explanation, different environments may be used, as appropriate, to implement various embodiments. The environment includes an electronic client device 2002, which can include any appropriate device operable to send and/or receive requests, messages, or information over an appropriate network 2004 and, in some embodiments, convey information back to a user of the device. Examples of such client devices include personal computers, cell phones, handheld messaging devices, laptop computers, tablet computers, set-top boxes, personal data assistants, embedded computer systems, electronic book readers, and the like. The network can include any appropriate network, including an intranet, the Internet, a cellular network, a local area network, a satellite network or any other such network and/or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a web server 2006 for receiving requests and serving content in response thereto, although for other networks an alternative device serving a similar purpose could be used as would be apparent to one of ordinary skill in the art.

The illustrative environment includes at least one application server 2008 and a data store 2010. It should be understood that there can be several application servers, layers or other elements, processes or components, which may be chained or otherwise configured, which can interact to perform tasks such as obtaining data from an appropriate data store. Servers, as used herein, may be implemented in various ways, such as hardware devices or virtual computer systems. In some contexts, servers may refer to a programming module being executed on a computer system. As used herein, unless otherwise stated or clear from context, the term "data store" refers to any device or combination of devices capable of storing, accessing and retrieving data, which may include any combination and number of data servers, databases, data storage devices and data storage media, in any standard, distributed, virtual or clustered environment. The application server can include any appropriate hardware, software and firmware for integrating with the data store as needed to execute aspects of one or more applications for the client device, handling some or all of the data access and business logic for an application. The application server may provide access control services in cooperation with the data store and is able to generate content including, but not limited to, text, graphics, audio, video and/or other content usable to be provided to the user, which may be served to the user by the web server in the form of HyperText Markup Language ("HTML"), Extensible Markup Language ("XML"), JavaScript, Cascading Style Sheets ("CSS") or another appropriate client-side structured language. Content transferred to a client device may be processed by the client device to provide the content in one or more forms including, but not limited to, forms that are perceptible to the user audibly, visually and/or through other senses including touch, taste, and/or smell. The handling of all requests and responses, as well as the delivery of content between the client device 2002 and the application server 2008, can be handled by the web server using PHP: Hypertext Preprocessor ("PHP"), Python, Ruby, Perl, Java, HTML, XML or another appropriate server-side structured language in this example. It should be understood that the web and application servers are not required and are merely example components, as structured code discussed herein can be executed on any appropriate device or host machine as discussed elsewhere herein. Further, operations described herein as being performed by a single device may, unless otherwise clear from context, be performed collectively by multiple devices, which may form a distributed and/or virtual system.

The data store 2010 can include several separate data tables, databases, data documents, dynamic data storage schemes and/or other data storage mechanisms and media for storing data relating to a particular aspect of the present disclosure. For example, the data store illustrated may include mechanisms for storing production data 2012 and user information 2016, which can be used to serve content for the production side. The data store also is shown to include a mechanism for storing log data 2014, which can be used for reporting, analysis or other such purposes. It should be understood that there can be many other aspects that may need to be stored in the data store, such as page image information and access rights information, which can be stored in any of the above listed mechanisms as appropriate or in additional mechanisms in the data store 2010. The data store 2010 is operable, through logic associated therewith, to receive instructions from the application server 2008 and obtain, update or otherwise process data in response thereto. The application server 2008 may provide static, dynamic, or a combination of static and dynamic data in response to the received instructions. Dynamic data, such as data used in web logs (blogs), shopping applications, news services and other such applications may be generated by server-side structured languages as described herein or may be provided by a content management system ("CMS") operating on, or under the control of, the application server. In one example, a user, through a device operated by the user, might submit a search request for a certain type of item. In this case, the data store might access the user information to verify the identity of the user and can access the catalog detail information to obtain information about items of that type. The information then can be returned to the user, such as in a results listing on a web page that the user is able to view via a browser on the user device 2002. Information for a particular item of interest can be viewed in a dedicated page or window of the browser. It should be noted, however, that embodiments of the present disclosure are not necessarily limited to the context of web pages, but may be more generally applicable to processing requests in general, where the requests are not necessarily requests for content.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment, in one embodiment, is a distributed and/or virtual computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 20. Thus, the depiction of the system 2000 in FIG. 20 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop, laptop or tablet computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network. These devices also can include virtual devices such as virtual machines, hypervisors and other virtual devices capable of communicating via a network.

Various embodiments of the present disclosure utilize at least one network that would be familiar to those skilled in the art for supporting communications using any of a variety of commercially-available protocols, such as Transmission Control Protocol/Internet Protocol ("TCP/IP"), User Datagram Protocol ("UDP"), protocols operating in various layers of the Open System Interconnection ("OSI") model, File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network, a satellite network, and any combination thereof.

In embodiments utilizing a web server, the web server can run any of a variety of server or mid-tier applications, including Hypertext Transfer Protocol ("HTTP") servers, FTP servers, Common Gateway Interface ("CGI") servers, data servers, Java servers, Apache servers, and business application servers. The server(s) also may be capable of executing programs or scripts in response to requests from user devices, such as by executing one or more web applications that may be implemented as one or more scripts or programs written in any programming language, such as Java®, C, C# or C++, or any scripting language, such as Ruby, PHP, Perl, Python or TCL, as well as combinations thereof. The server(s) may also include database servers, including without limitation those commercially available from Oracle®, Microsoft®, Sybase®, and IBM® as well as open-source servers such as MySQL, Postgres, SQLite, MongoDB, and any other server capable of storing, retrieving, and accessing structured or unstructured data. Database servers may include table-based servers, document-based servers, unstructured servers, relational servers, non-relational servers or combinations of these and/or other database servers.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU" or "processor"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as, but not limited to, volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including" and "containing" are to be construed as open-ended terms (i.e., meaning "including, but not limited to,") unless otherwise noted. The term "connected," when unmodified and referring to physical connections, is to be construed as partly or wholly contained within, attached to or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present.

Operations of processes described herein can be performed in any suitable order unless otherwise indicated herein or otherwise clearly contradicted by context. Processes described herein (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A computer-implemented method, comprising:
under the control of one or more computer systems configured with executable instructions,
generating, from a plurality of received archives using a redundancy code, a set of shards representing the plurality of archives, a minimum quorum quantity of the shards in the set being usable, by the redundancy code, to generate original data of the archives, the set of shards including at least:
identity shards that contain the original data of the plurality of archives, and
encoded shards representing an encoded form of the original data; and
storing the set of shards on a set of storage devices, the set of storage devices having a quantity of storage devices that is associated with the minimum quorum quantity, such that a quantity of shards of the set of shards stored on the storage devices is an integer multiple of the quantity of storage devices, the integer multiple being two or greater;
in response to receiving a request for at least some of the stored plurality of archives, at least:
determining at least one of the respective storage devices on which a respective identity shard corresponding to the requested archives is stored;
determining performance characteristics for the determined storage device; and
if the determined performance characteristics are insufficient to complete retrieval of the respective identity shard within a timeframe determined for the retrieval, retrieve the requested archives by at least:
retrieving the requested archives from the determined storage devices having the corresponding identity shard; and augmenting the retrieval of the requested archives by generating, using the redundancy code, original data corresponding to the requested archives from the shards stored on at least a portion of a remainder of the storage devices of the plurality of storage devices.

2. The computer-implemented method of claim 1, wherein each storage device of the plurality of storage devices is a physically separate data storage facility.

3. The computer-implemented method of claim 1, wherein the quantity of storage devices in the set of storage devices is associated with the minimum quorum quantity by being directly related to parameters of the redundancy code.

4. The computer-implemented method of claim 1, wherein the parameters include a quantity of shards of the set of shards to be stored so as to represent the archives.

5. A system, comprising:
at least one computing device configured to implement one or more services, wherein the one or more services are configured to:
process received archives to generate two or more sets of shards representing the plurality of archives, a minimum quorum quantity of the shards across the two or more sets of shards being usable to generate unavailable shards in the any set of the two or more sets of shards, the two or more sets of shards including at least:
identity shards that contain the original data of the plurality of archives, and
encoded shards representing an encoded form of the original data; and
store each set of the two or more sets of shards across a set of storage devices, such that shards of at least two sets of the two or more sets are stored on each storage device of the set of storage devices;
in response to receiving a request for retrieval of the archives, at least:
retrieve the archives from a corresponding identity shard among the identity shards; and
augment the retrieval of the archives by generating the requested archives from at least a subset of the encoded shards and at least a subset of a remainder of the identity shards.

6. The system of claim 5, wherein each shard of the two or more sets of shards is stored on a respective volume of a set of volumes associated with the system.

7. The system of claim 6, wherein each respective volume of the set of volumes is associated with a respective storage device of the set of storage devices.

8. The system of claim 7, wherein each storage device of the set of storage devices is a data storage facility.

9. The system of claim 5, wherein the services are further configured to determine whether a storage device on which the corresponding identity shard is stored is capable of providing the archives within a timeframe determined for retrieving the archives.

10. The system of claim 9, wherein the services are further configured to augment the retrieval of the archives if determined that the storage device is incapable of providing the archives within the timeframe.

11. The system of claim 5, wherein the services are further configured to execute the retrieval of the archives from the corresponding identity shard and the augmentation of the retrieval by generating the archives in parallel with the retrieval.

12. The system of claim 5, wherein the services are further configured to provide the archive to a customer of the system via a programmatic interface.

13. A non-transitory computer-readable storage medium having stored thereon executable instructions that, when executed by one or more processors of a computer system, cause the computer system to at least:
cause generation, by a redundancy code, of two or more sets of shards representing a plurality of archives to be stored by the computer system, a minimum quorum quantity of the shards across the two or more sets of shards being usable to generate unavailable shards in the any set of the two or more sets of shards, the two or more sets of shards including at least:
identity shards that contain the original data of the plurality of archives, and
encoded shards representing an encoded form of the original data; and
cause storage of each set of the two or more sets of shards across a set of storage devices associated with the computer system, such that shards of at least two sets of the two or more sets are stored on each storage device of the set of storage devices;
service requests for retrieving the archives, by at least:
determining whether the storage device associated with an identity shard corresponding to the requested archives is capable of accommodating the requests within a timeframe determined for the requests;
if the storage device is capable of accommodating the requests within the timeframe, then causing retrieval of the corresponding identity shard; and
if the storage device is not capable of accommodating the requests within the timeframe, then at least:
causing retrieval of at least a subset of a remainder of the shards; and
causing generation of the requested archives from the subset of the remainder of the shards.

14. The non-transitory computer-readable storage medium of claim 13, wherein the instructions further comprise instructions that, when executed by the one or more processors, cause the computer system to receive the archives in connection with storage requests.

15. The non-transitory computer-readable storage medium of claim 14, wherein the instructions further comprise instructions that, when executed by the one or more processors, cause the computer system to generate the two or more sets of shards.

16. The non-transitory computer-readable storage medium of claim 13, wherein the instructions further comprise instructions that, when executed by the one or more processors, cause the computer system to monitor performance characteristics of the set of storage devices to enable determinations of whether the requests will be accommodated within the timeframe.

17. The non-transitory computer-readable storage medium of claim 13, wherein at least some of the storage devices of the set of storage devices have different performance characteristics.

18. The non-transitory computer-readable storage medium of claim 13, wherein the redundancy code is an erasure code.

19. The non-transitory computer-readable storage medium of claim 13, wherein each storage device of the set of storage devices is a data storage facility.

20. The non-transitory computer-readable storage medium of claim 13, wherein the set of storage devices is under control of a data storage facility.

* * * * *